United States Patent
Glass et al.

(10) Patent No.: US 9,859,424 B2
(45) Date of Patent: Jan. 2, 2018

(54) TECHNIQUES FOR INTEGRATION OF GE-RICH P-MOS SOURCE/DRAIN CONTACTS

(71) Applicant: INTEL CORPORATION, Santa Clara, CA (US)

(72) Inventors: Glenn A. Glass, Portland, OR (US); Anand S. Murthy, Portland, OR (US); Tahir Ghani, Portland, OR (US); Ying Pang, Portland, OR (US); Nabil G. Mistkawi, Keizer, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/116,453

(22) PCT Filed: Mar. 21, 2014

(86) PCT No.: PCT/US2014/031486
§ 371 (c)(1),
(2) Date: Aug. 3, 2016

(87) PCT Pub. No.: WO2015/142357
PCT Pub. Date: Sep. 24, 2015

(65) Prior Publication Data
US 2017/0012124 A1     Jan. 12, 2017

(51) Int. Cl.
*H01L 29/78* (2006.01)
*H01L 29/08* (2006.01)
(Continued)

(52) U.S. Cl.
CPC .......... *H01L 29/7848* (2013.01); *B82Y 10/00* (2013.01); *H01L 21/02532* (2013.01);
(Continued)

(58) Field of Classification Search
CPC .......... H01L 29/7848; H01L 21/30604; H01L 29/167; H01L 21/02532; H01L 29/0649;
(Continued)

(56) References Cited

U.S. PATENT DOCUMENTS 6,653,700 B2 * 11/2003 Chau ................. H01L 29/41783
257/347
2006/0148181 A1   7/2006 Chan et al.
(Continued)

FOREIGN PATENT DOCUMENTS

| TW | 201342614 A | 10/2013 |
|---|---|---|
| WO | 2011033695 A1 | 3/2011 |
| WO | 2015142357 A1 | 9/2015 |

OTHER PUBLICATIONS

International Preliminary Report on Patentability received in PCT Application No. PCT/US14/031486. dated Sep. 29, 2016. 10 pages.
(Continued)

*Primary Examiner* — Jonathan Han
(74) *Attorney, Agent, or Firm* — Finch & Maloney PLLC

(57) ABSTRACT

Techniques are disclosed for improved integration of germanium (Ge)-rich p-MOS source/drain contacts to, for example, reduce contact resistance. The techniques include depositing the p-type Ge-rich layer directly on a silicon (Si) surface in the contact trench location, because Si surfaces are favorable for deposition of high quality conductive Ge-rich materials. In one example method, the Ge-rich layer is deposited on a surface of the Si substrate in the source/drain contact trench locations, after removing a sacrificial silicon germanium (SiGe) layer previously deposited in the source/drain locations. In another example method, the Ge-rich layer is deposited on a Si cladding layer in the contact trench locations, where the Si cladding layer is deposited on a functional p-type SiGe layer. In some cases,
(Continued)

the Ge-rich layer comprises at least 50% Ge (and may contain tin (Sn) and/or Si) and is boron (B) doped at levels above $1E20$ $cm^{-3}$.

25 Claims, 14 Drawing Sheets

(51) Int. Cl.
| | |
|---|---|
| H01L 29/167 | (2006.01) |
| H01L 21/8238 | (2006.01) |
| B82Y 10/00 | (2011.01) |
| H01L 29/775 | (2006.01) |
| H01L 29/06 | (2006.01) |
| H01L 29/417 | (2006.01) |
| H01L 29/66 | (2006.01) |
| H01L 29/165 | (2006.01) |
| H01L 21/02 | (2006.01) |
| H01L 21/306 | (2006.01) |
| H01L 21/762 | (2006.01) |
| H01L 27/092 | (2006.01) |
| H01L 29/45 | (2006.01) |
| H01L 29/423 | (2006.01) |
| H01L 29/786 | (2006.01) |

(52) U.S. Cl.
CPC .. *H01L 21/30604* (2013.01); *H01L 21/76224* (2013.01); *H01L 21/823807* (2013.01); *H01L 21/823814* (2013.01); *H01L 21/823821* (2013.01); *H01L 21/823878* (2013.01); *H01L 27/0924* (2013.01); *H01L 29/0649* (2013.01); *H01L 29/0673* (2013.01); *H01L 29/0847* (2013.01); *H01L 29/165* (2013.01); *H01L 29/167* (2013.01); *H01L 29/41783* (2013.01); *H01L 29/42392* (2013.01); *H01L 29/45* (2013.01); *H01L 29/66545* (2013.01); *H01L 29/66636* (2013.01); *H01L 29/66795* (2013.01); *H01L 29/775* (2013.01); *H01L 29/785* (2013.01); *H01L 29/78696* (2013.01); *H01L 29/78* (2013.01)

(58) Field of Classification Search
CPC ........... H01L 21/76224; H01L 29/0847; H01L 29/45; H01L 27/0924; H01L 21/823878; H01L 29/66545; H01L 29/165; H01L 29/66636; H01L 29/41783; H01L 29/0673; H01L 29/775; H01L 21/823821; H01L 21/823807; H01L 21/823814; H01L 29/78; B82Y 10/00
USPC ........... 438/151, 285; 257/E21.409, E29.255
See application file for complete search history.

(56) References Cited

U.S. PATENT DOCUMENTS

| 2007/0187767 | A1 | 8/2007 | Yasutake | |
| 2008/0197412 | A1* | 8/2008 | Zhang | H01L 29/0847 257/344 |
| 2009/0302348 | A1 | 12/2009 | Adam et al. | |
| 2011/0014765 | A1 | 1/2011 | Fukuda et al. | |
| 2011/0068407 | A1 | 3/2011 | Yeh et al. | |
| 2013/0240989 | A1* | 9/2013 | Glass | H01L 21/28512 257/335 |
| 2013/0248930 | A1* | 9/2013 | Shimamune | H01L 21/02381 257/192 |
| 2014/0001520 | A1* | 1/2014 | Glass | H01L 29/66439 257/288 |
| 2014/0054658 | A1 | 2/2014 | Ma et al. | |
| 2014/0070377 | A1* | 3/2014 | Yu | C30B 25/165 257/655 |
| 2015/0270284 | A1* | 9/2015 | Chou | H01L 27/1203 257/347 |

OTHER PUBLICATIONS

Taiwan Office Action and Search Report received for Application No. 104104385, dated Jul. 21, 2016. 10 pages.
International Search Report and Written Opinion received in PCT Application No. PCT/US14/031486. dated Dec. 15, 2014, 14 pages.
Extended European Search Report received for EP Application No. 14886485.3, dated Nov. 3, 2017. 13 pages.
Yamashiro, et al., "Super self-aligned technology of ultra-shallow junction in MOSFETs using selective Si1-xGex CVD," Elsevier, Materials Science & Engineering B89, 2002. pp. 120-124.
Hikavyy, et al., "High Ge Content SiGe Selective Processes for Source/Drain in Manufacturing the Next Generations of pMOS Transistors," ESC Journal of Solid State Science and Technology, 2 (6), 2013. pp. 282-286.
Liow, et al., "Strained Silicon Nanowire Transistors With Germanium Source and Drain Stressors," IEEE Transactions on Electron Devices, vol. 55. No. 11. Nov. 2008. pp. 3048-3055.
Takehiro, et al., "High-Performance pMOSFETs with High Ge Fraction Strained SiGe-Heterostructure Channel and Ultrashallow Source/Drain Formed by Selective B-Doped SiGe CVD", Electrical Engineering in Japan, vol. 165, No. 3, 2008. 5 pages.

* cited by examiner

TECHNIQUES FOR INTEGRATION OF GE-RICH P-MOS SOURCE/DRAIN CONTACTS

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal-oxide-semiconductor (MOS) transistor devices, such as those used in complementary metal-oxide-semiconductor (CMOS) devices, it is often desired to minimize resistance associated with source/drain regions and contacts, otherwise known as components of external resistance. Decreasing external resistance enables improved transistor current for a given source to drain.

BRIEF DESCRIPTION OF THE DRAWINGS

FIG. 1' is a method of forming a transistor using a functional SiGe layer and including a Ge-rich source/drain contact layer deposited on a Si surface, in accordance with one or more embodiments of the present disclosure.

DETAILED DESCRIPTION

Figure 1:
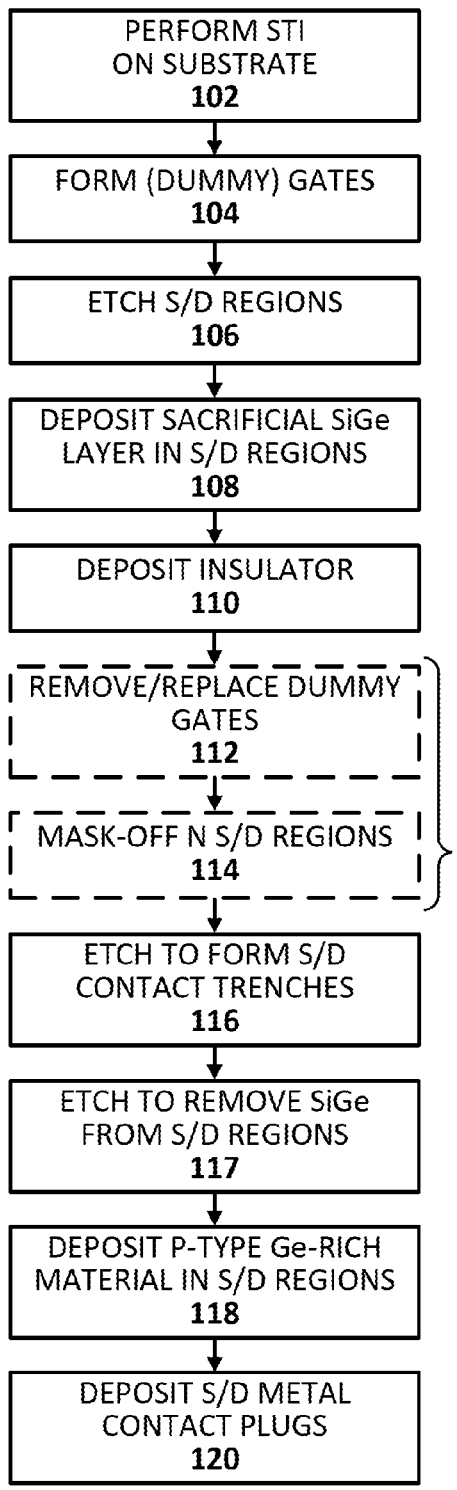
FIG. 1 is a method of forming a transistor using a sacrificial silicon germanium (SiGe) layer and including a germanium (Ge)-rich source/drain contact layer deposited on a silicon (Si) surface, in accordance with one or more embodiments of the present disclosure.
Figure 1:
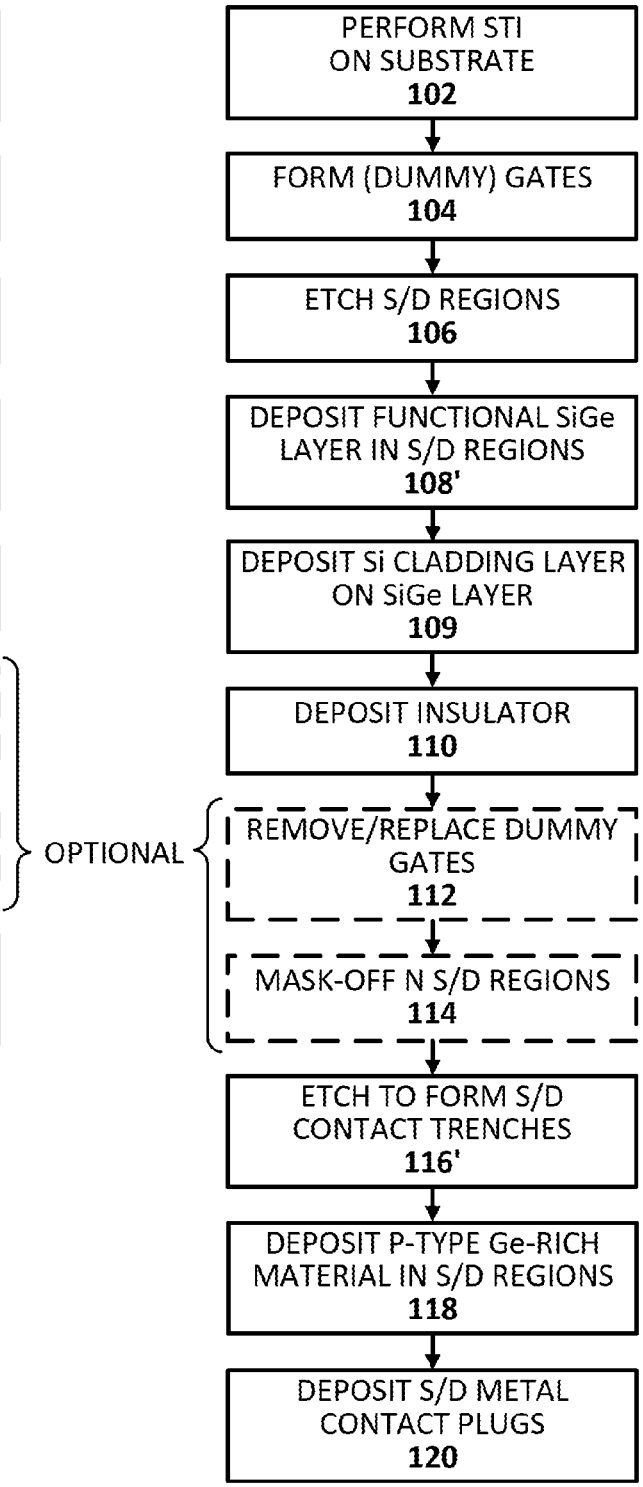

Techniques are disclosed for improved integration of germanium (Ge)-rich p-MOS source/drain contacts to, for example, reduce contact resistance. The techniques include depositing the p-type Ge-rich layer directly on a silicon (Si) surface in the contact trench location, because Si surfaces are favorable for deposition of high quality conductive Ge-rich materials. In one example method, the Ge-rich layer is deposited on a surface of the Si substrate in the source/drain contact trench locations, after removing a sacrificial silicon germanium (SiGe) layer previously deposited in the source/drain locations. In another example method, the Ge-rich layer is deposited on a Si cladding layer in the contact trench locations, where the Si cladding layer is deposited on a functional p-type SiGe layer. In some cases, the Ge-rich layer comprises at least 50% Ge (and may contain tin (Sn) and/or Si) and is boron (B) doped at levels above $1E20$ $cm^{-3}$. Numerous transistor configurations and suitable fabrication processes will be apparent in light of this disclosure, including both planar and non-planar transistor structures (e.g., finned and nanowire/nanoribbon configurations). The techniques are particularly well-suited for implementing p-type MOS (p-MOS) devices, although other transistor configurations may benefit as well, such as complementary MOS (CMOS) devices. Numerous configurations and variations will be apparent in light of this disclosure.

General Overview

As previously explained, increased drive current in transistors can generally be achieved by reducing external resistance, such as contact resistance. In some cases, contact resistance can be reduced for p-type MOS (p-MOS) transistors by using a germanium (Ge)-rich material as an effective ohmic contact material. However, issues can arise in preserving the Ge-rich material through the MOS fabrication process flow if it is deposited at the source/drain location. For example, the Ge-rich material may be susceptible to erosion and unintentional removal in the etch, ash, and anneal associated with contact loop processing. Issues can also arise in obtaining good quality deposition (e.g., as judged by film conductivity) of the Ge-rich material when the material is deposited in the contact trench location. For example, the surface in the contact trench location that the Ge-rich material is being deposited on may be 'dirty' (e.g., as a result of contact loop processing) and/or difficult to clean. If Ge-rich materials are deposited on 'dirty' surfaces, then the result may produce poor crystal quality in the sense of amorphous atomic arrangement in local regions or in entirety. Poor crystallinity results in poor dopant activation and high contact resistance.

Thus, and in accordance with one or more embodiments of the present disclosure, techniques are disclosed for improved integration of Ge-rich p-MOS source/drain contacts to, for example, reduce contact resistance. As previously described, Ge-rich material can be used as an effective ohmic contact material; however, issues can arise with preserving the Ge-rich layer if it is deposited too early in the process flow (e.g., during source/drain processing prior to contact loop processing) or obtaining a good quality deposition for the Ge-rich layer if it is deposited later in the process flow (e.g., due to the 'dirty' and/or difficult to clean surface it is being deposited on). Therefore, the techniques variously described herein include depositing the Ge-rich layer directly on a silicon (Si) surface in the contact trench location, due to Si having the property that it is easier to achieve epitaxial quality clean surfaces (e.g., as compared to silicon germanium (SiGe), which is typically used for the p-MOS source and drain). Note that the Ge-rich layer as variously described herein is to be used for p-MOS source/drain contacts and is therefore a p-type layer, meaning it has p-type doping (e.g., using boron (B), gallium (Ga), and/or any other suitable dopant).

As will be apparent in light of this disclosure, depositing the Ge-rich layer directly on a clean Si surface is generally achieved using one of two methods: 1) depositing the Ge-rich layer on a surface of the Si substrate in the contact trench locations, after removing a sacrificial SiGe layer or 2) depositing the Ge-rich layer on a Si cladding layer in the contact trench locations, where the Si cladding layer is deposited on a functional p-type SiGe layer. Note that in both of these methods, a SiGe layer (whether sacrificial or functional) is deposited in the source/drain locations prior to contact loop processing. Also note that, in embodiments of the first method, the SiGe layer is a sacrificial layer, while in embodiments of the second method, the SiGe layer is a functional layer, as will be discussed in more detail herein. Further note that although the SiGe layer is referred to as sacrificial in some instances, it may be p-type doped and therefore capable of being functional; however, the SiGe layer is referred to as sacrificial because it is intended to be removed during the processing of p-contacts, as will be apparent in light of this disclosure.

In embodiments where the SiGe layer is sacrificial, the SiGe layer may comprise 15-30% Ge, in some cases. Although, in some instances, the sacrificial layer may range from 10% Ge to pure Ge. Further, the sacrificial SiGe layer may also be undoped, in some cases.

Although, in other cases, the sacrificial layer may have some amount of p-type doping. In some embodiments, the sacrificial SiGe layer is removed using a SiGe etch that is selective to Si and insulator materials. Such selective etches may include, for example, wet etches including water, nitric acid, organic acid (e.g., acetic or citric), and/or hydrofluoric acid, and the selective etches may have a usable etch rate of about 300 Å/min, for example.

In embodiments where the SiGe layer is functional, the SiGe layer may comprise 30-70% Ge, in some cases (e.g., to maximize strain for performance reasons). Further, in such embodiments, the functional SiGe layer is p-type doped (e.g., B doped). In embodiments where the SiGe layer is functional, a Si cladding layer can be deposited on the functional SiGe layer before contact loop processing. Then, during contact trench processing, the contact trench etch can be performed in a manner such that the Si cladding layer is preserved for subsequent deposition of the Ge-rich layer. In such cases, an etch stop layer (e.g., nitride, carbide, or some other suitable material having a sufficiently different etch rate compared to the oxide/insulator material above it) can be used to assist with preserving the Si cladding layer during contact trench etch, as will be discussed in more detail herein.

In some embodiments, the Ge-rich layer material may comprise at least 50% Ge (up to 100% Ge), and may also include Si and tin (Sn). For example, in some cases, the Ge-rich material may be SiGe, having Ge in the range of 50-99%. In other cases, the Ge-rich material may be germanium tin (GeSn), with up to 15% Sn, and may, in some instances, contain trace levels of Si (e.g., <5%). Recall that the Ge-rich layer is a p-type layer and therefore is p-type doped (e.g., B doped). In some cases, the p-type Ge-rich layer may be B doped at levels around 2E20 $cm^{-3}$. Although, in some instances, the p-type Ge-rich layer may be B doped at levels above 5E19 $cm^{-3}$, and up to 5E21 $cm^{-3}$. In some embodiments, depositing the Ge-rich layer includes processing with maximum temperatures of 550 or 500 degrees C., for example.

The techniques as variously described herein can be used to form transistor devices in any number of devices and systems. In some embodiments, such as CMOS devices having both n-type MOS (n-MOS) and p-MOS transistors, n-type regions may be present. In such cases where n-type regions are also present, the contacts can be patterned so as to open the p-contacts separately from the n-contacts. This can also offer the benefit that when the n-contacts are independently opened, an n-type specific metal may be used for contact resistance lowering reasons. Further, additional benefit may be received as a result of the p and n-contact metals not having to be shared, as in conventional contact processing. In other embodiments, selectivity may include natural selectivity. For instance, while the p-type Ge-rich layer grows on Si surfaces, it does not grow on insulator surfaces such as silicon dioxide ($SiO_2$) or silicon nitride (SiN); nor does it grow on, for instance, exposed heavily phosphorous doped silicon in n-type regions.

The techniques provided herein can be employed to improve device resistance in any number of transistor structures and configurations, including planar, flush or raised source/drain, non-planar (e.g., nanowire transistors and finned transistors such as double-gate and tri-gate transistor structures), as well as strained and unstrained channel structures. The source/drain areas can be recessed (e.g., using an etch process) or not recessed (e.g., formed on top surface of substrate). In addition, the transistor devices may optionally include source and drain tip regions that are designed, for instance, to decrease the overall resistance of the transistor while improving short channel effects (SCE), but such tip regions are not required. The transistor devices may further include any number of gate configurations, such as poly gates, high-k dielectric metal gates, replacement metal gate (RMG) process gates, or any other gate structure. Any number of structural features can be used in conjunction with low resistance transistor techniques as described herein.

Upon analysis (e.g., using scanning/transmission electron microscopy (SEM/TEM) and/or composition mapping), a structure configured in accordance with one or more embodiments will effectively show contact regions including a Ge-rich layer deposited on a Si surface (e.g., a surface of the Si substrate or a surface of a Si cladding layer). In addition, such structures when on an integrated circuit can be compared to source/drain regions on the integrated circuit that do not have contacts. In such contact-less source/drain regions (e.g., source/drain regions that were not opened during contact trench etch for contact processing), a SiGe layer may be present in the source/drain locations as variously described herein. For example, in cases where the SiGe layer was intended to be sacrificial for subsequent contact processing, the SiGe layer may comprise 15-30% Ge and may be undoped. In cases where the SiGe layer was intended to be functional for subsequent contact processing, the SiGe layer may comprise 30-70% Ge and be p-type doped (e.g., B doped). In addition, in such cases, the SiGe layer may include a Si cladding layer. Also, in some cases, transistors fabricated using the techniques variously described herein can provide an improvement over conventional structures with respect to, at least, a reduction in contact resistance (e.g., resulting in a 20-30% current flow improvement for a given operating voltage). Further, the cleanliness of the interface between the Ge-rich layer and the Si surface the Ge-rich layer is directly deposited on (e.g., as compared to the interface between a Ge-rich layer and a SiGe surface) can be detected by secondary ion mass spectrometry (SIMS) or by ion probe, for example. Numerous configurations and variations will be apparent in light of this disclosure.

Architecture and Methodology

FIGS. 1 and 1' are methods of forming a transistor including a Ge-rich source/drain contact layer deposited on Si, in accordance with one or more embodiments of the present disclosure. FIGS. 2A-H' illustrate example structures that are formed when carrying out the method of either of FIG. 1 or 1' for planar or non-planar transistor architecture, in accordance with various embodiments. As will be apparent in light of the present disclosure, for non-planar transistor architectures, such as finned architectures (e.g., tri-gate or finFET), FIGS. 2A-H' may illustrate a cross-sectional view taken along the length of the semiconductor fin. The example methods shown in FIGS. 1 and 1' include forming one or more gate stacks on a semiconductor substrate upon which one or more transistor devices (e.g., MOS devices) may be formed, the gate stacks being formed above channel regions and having source/drain regions adjacent to the channel region. The MOS devices may comprise, for example, p-MOS transistors, or both n-MOS and p-MOS transistors (e.g., for CMOS devices).

FIG. 1 shows a method of forming a transistor including a Ge-rich source/drain layer deposited on a surface of the Si substrate after removing a sacrificial SiGe layer after performing contact trench etch, in accordance with some embodiments. FIG. 1' shows a method of forming a transistor including a Ge-rich source/drain layer deposited on a Si cladding layer after contact trench etch, where the Si cladding layer is deposited on a functional p-type SiGe layer, in accordance with some embodiments. Therefore, in some embodiments, a SiGe layer will be deposited in the source/drain regions as a sacrificial layer, while in other embodiments, the SiGe layer will be deposited in the source/drain regions as a functional layer. The properties of the SiGe layer (e.g., % Ge, doping amount, etc.) may depend upon whether the SiGe layer is to be used as a sacrificial layer (e.g., as is the case in the method of FIG. 1) or as a functional source/drain layer (e.g., as is the case in the method of FIG. 1'), as will be apparent in light of this disclosure.

As can be seen in FIGS. 1 and 1', the example methods include performing 102 shallow trench isolation (STI) on a semiconductor substrate. The substrate may be formed using a silicon base or substrate, such as a silicon single crystal wafer. Substrate may be implemented, for example, with a bulk silicon, a silicon-on-insulator configuration (SOI), or with multi-layered structures, including those substrates upon which single composition fins or multilayers with different composition for fabricating nanowires/nanoribbons are formed prior to a subsequent gate patterning process. In other implementations, the semiconductor substrate may be formed using alternate materials, which may or may not be combined with silicon, such as germanium. In a more general sense, any material that may serve as a foundation upon which a semiconductor device may be built can be used in accordance with embodiments of the present disclosure. The STI process may include patterning the diffusion regions, etching STI trenches, depositing an insulative or oxide or inter-layer dielectric (ILD) material, and polishing the deposited STI material. In some cases, such as for non-planar architectures, the STI process may also include recessing the STI material. In some cases, such as for planar architectures, the plane of the diffusion region may be nominally planar with the top of the STI (e.g., within approximately 10 nm). In the case of non-planar architectures, such as those used for finned or nanowire/nanoribbon transistor devices, the STI locations may be where the diffusion is defined as narrow structures that are then made to exude out of the plane of the STI material (e.g., the level of the diffusion is 10 nm or more above the level of the top STI plane). Note that in other embodiments, another suitable form of isolation (other than STI) may be used to separate the diffusion regions on the semiconductor substrate.

The methods of FIGS. 1 and 1' continue with forming 104 gates or gate stacks on the semiconductor substrate. The gates or gate stacks can be formed as conventionally done or using any suitable custom techniques. In some embodiments, the gate stack may be formed by depositing and then patterning a gate dielectric layer and a gate electrode layer. For example, a gate dielectric layer may be blanket deposited onto the substrate using conventional deposition processes such as chemical vapor deposition (CVD), atomic layer deposition (ALD), spin-on deposition (SOD), or physical vapor deposition (PVD). Alternate deposition techniques may be used as well, such as thermally growing the gate dielectric layer, for example. The gate dielectric material may be formed, for example, from materials such as silicon dioxide or high-k dielectric materials. Examples of high-k gate dielectric materials include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some example embodiments, the dummy or high-k gate dielectric layer may be between around 5 Å to around 200 Å thick (e.g., 20 Å to 50 Å). In general, the thickness of the gate dielectric layer should be sufficient to electrically isolate the gate electrode from the neighboring source and drain contacts. In further embodiments, additional processing may be performed on the high-k gate dielectric layer, such as an annealing process to improve the quality of the high-k material.

A gate electrode material may then be deposited on the gate dielectric layer using similar deposition techniques as described above, such as ALD, CVD, or PVD. In some such specific embodiments, the gate electrode material may be polysilicon or a metal layer, although other suitable gate electrode materials can be used as well. The gate electrode material, which can be a sacrificial or dummy material that is later removed for a replacement gate process, such as a replacement metal gate (RMG) process, can have a thickness in the range of 50 Å to 500 Å (e.g., 100 Å), in some example embodiments. The RMG process will be discussed in more detail below. Use of gate first/gate last, RMG, or conventional $SiO_2$/poly gate are all compatible with this disclosure.

The methods of FIGS. 1 and 1' continue with etching 106 the source/drain regions of the transistor structure to form source/drain cavities. Etching 106 to form source/drain cavities can be performed as conventionally done or using any number of suitable processes. In some example cases, this includes ion implantation to highly dope portions of the substrate adjacent to the gate stack followed by annealing to drive the dopants further into the substrate to improve the etch rate of the intended source/drain areas. A dry etch process can then be used to etch the doped regions of the substrate to form source/drain cavities and, in some cases, respective tip areas. After the dry etch process has completed, a wet etch may be used, for instance, to clean and further etch the areas. Such wet etching (which can be carried out using conventional or custom wet etch chemistries), can be used to remove contaminants such as carbon, fluorine, chlorofluorocarbons, and oxides such as silicon oxide to provide a clean surface upon which subsequent processes may be carried out. In addition, and assuming a monocrystalline silicon substrate, the wet etching may also be used to remove a thin portion of the substrate along the <111> and <001> crystallographic planes to provide a smooth surface upon which a high quality epitaxial deposition may occur. In some example cases, the thin portion of the substrate that is etched away may be, for example, up to 5 nm thick and may also remove residual contaminants. As will be appreciated, in some embodiments, the source/drain regions need not be recessed or otherwise etched. In such cases, the source/drain materials can be formed on the semiconductor substrate without any etching.

Figure 2A:
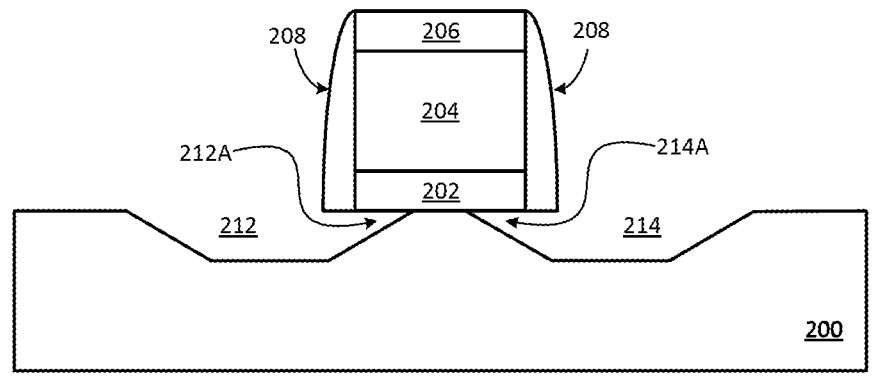
FIGS. 2A-H' illustrate example structures that are formed when carrying out the method of either of FIG. 1 or 1' for planar or non-planar transistor architecture, in accordance with various embodiments.

FIG. 2A shows an example resulting structure after performing 102 STI on a substrate 200, forming 104 a gate stack over a channel region (the gate stack including gate dielectric layer 202, gate electrode layer 204, and optional hardmask 206), and etching 106 source/drain cavities 212/214, as variously described above. The optional gate hardmask layer 206 can be used to provide certain benefits or uses during processing, such as protecting gate electrode 204 from subsequent etch and/or ion implantation processes. Hardmask layer 206 may be formed using typical hardmask materials, such as such as silicon dioxide, silicon nitride, and/or other conventional insulator materials.

As can also be seen in FIG. 2A, spacers 208 are formed adjacent to the gate stack and source/drain cavities 212/214 include optional tip regions 212A/214A, respectively. Spacers 208 may be formed, for example, using conventional materials such as silicon oxide, silicon nitride, or other suitable spacer materials. The width of spacers 208 may generally be chosen based on design requirements for the transistor being formed. Source/drain cavities 212/214 effectively define the location of the source/drain regions, in this example embodiment, and, as can be seen, source/drain cavity tip regions 212A/214A undercut gate dielectric 302.

Figure 2B:
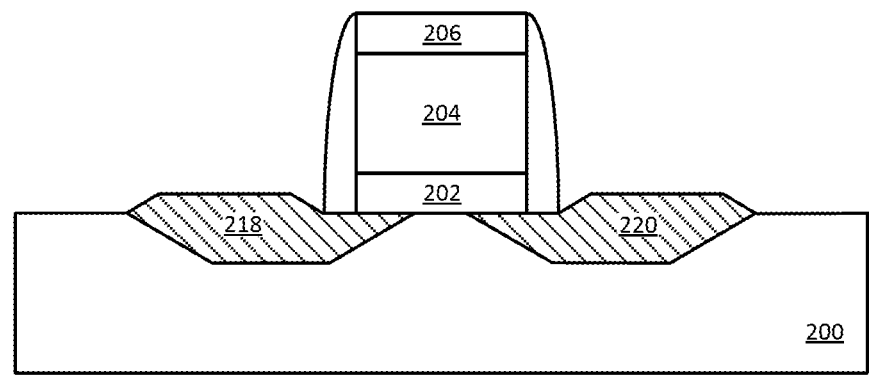
Figure 2B:
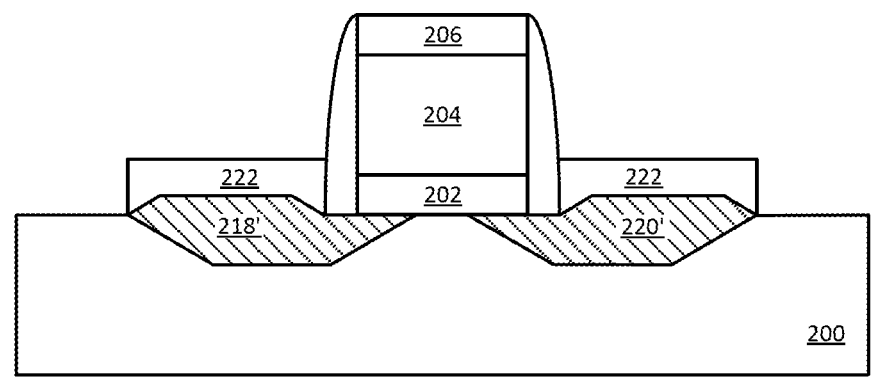

The method of FIG. 1 continues with depositing 108 a sacrificial SiGe layer 218/220 in the source/drain cavities 212/214, respectively, to grow back the source/drain regions, as shown in the resulting structure of FIG. 2B, in accordance with an embodiment. Recall that in the method of FIG. 1, the SiGe layer is intended to be a sacrificial layer to be removed in subsequent processing to expose a surface of the Si substrate, as will be discussed herein. In embodiments where the SiGe layer is sacrificial, the SiGe layer may comprise 15-30% Ge, in some cases. Although, in some instances, the sacrificial layer may range from 10% Ge to pure Ge. Further, the sacrificial SiGe layer may also be undoped, in some cases. Although, in other cases, the sacrificial layer may have some amount of p-type doping.

In the method of FIG. 1', the SiGe layer 218'/220' (deposited 108' in the source/drain cavities 212/214, as shown in FIG. 2B') is intended to be a functional source/drain layer. In such embodiments, the functional SiGe layer may comprise 30-70% Ge, in some cases (e.g., to maximize strain for performance reasons). Further, in such embodiments, the SiGe layer is p-type doped (e.g., B doped), since it is a functional source/drain layer (as opposed to being a sacrificial layer to be subsequently removed). For example, the B concentration can be in excess of 1E20 cm$^{-3}$, or any other suitable concentration to allow SiGe layer 218'/220' to be a functional layer for a p-MOS device. The method of FIG. 1' continues with depositing 109 a Si cladding layer on SiGe layer 218'/220' in the source/drain locations, to form the resulting example structure shown in FIG. 2B'.

Depositing 108, 108', and 109 can be carried out, for example, using selective epitaxial deposition, although any suitable deposition process can be used. For example, depositing 108 and 109 may be carried out in a CVD reactor, an LPCVD reactor, or an ultra-high vacuum CVD (UHVCVD). In some example cases, the reactor temperature may fall, for instance, between 600° C. and 800° C. and the reactor pressure may fall, for instance, between 1 and 760 Torr. The carrier gas may include, for example, hydrogen or helium at a suitable flow rate, such as between 10 and 50 SLM. In some example cases, an etching agent may be added to increase the selectivity of the deposition. For instance, HCl or Cl$_2$ may be added at a flow rate that ranges, for example, between 50 and 300 SCCM. In cases of p-type doping (e.g., where SiGe layer 218'/220' is p-type doped), an in situ doping of boron, diluted B$_2$H$_6$, may be used (e.g., the B$_2$H$_6$ may be diluted in H$_2$ at 1-20%). For instance, the diluted B$_2$H$_6$ may be used at a 3% concentration and at a flow rate that ranges between 10 and 100 SCCM. In some cases, the deposition may be a graded deposition based on concentration of materials and/or p-type dopant. Various other suitable deposition techniques may be used as will be apparent in light of this disclosure.

Figure 2C:
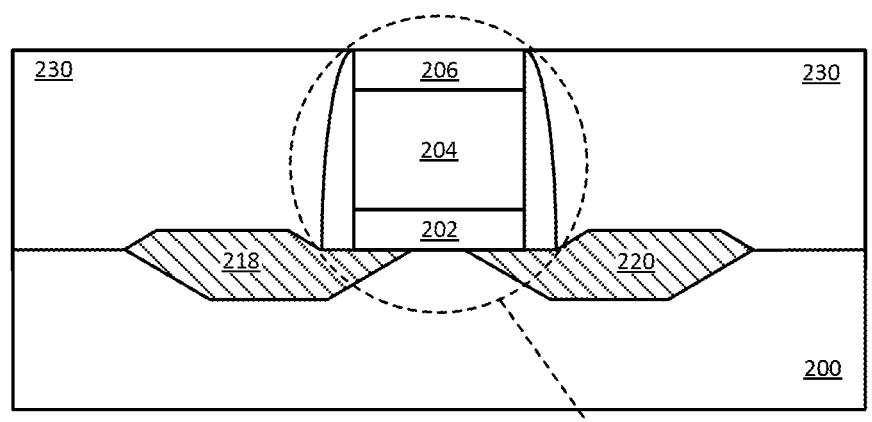

The methods of FIGS. 1 and 1' continue with depositing 110 an insulator layer 230 and then polishing/planarizing as commonly done to form the structure shown in FIG. 2C. Note that in the case of FIG. 1', cladding layer 222 would be shown on top of functional SiGe layers 218'/220'. Insulator layer 230 may be formed using materials known for the applicability in insulator layers for transistor and integrated circuit structures, such as low-k dielectric (insulator) materials. Such insulator materials include, for example, oxides such as silicon dioxide (SiO$_2$) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. In some example configurations, the insulator layer may include pores or other voids to further reduce its dielectric constant.

Figure 2D:
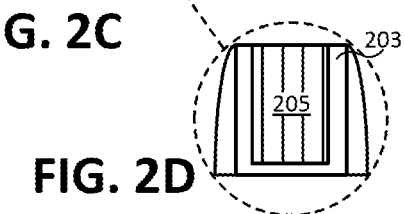
Figure 2E:
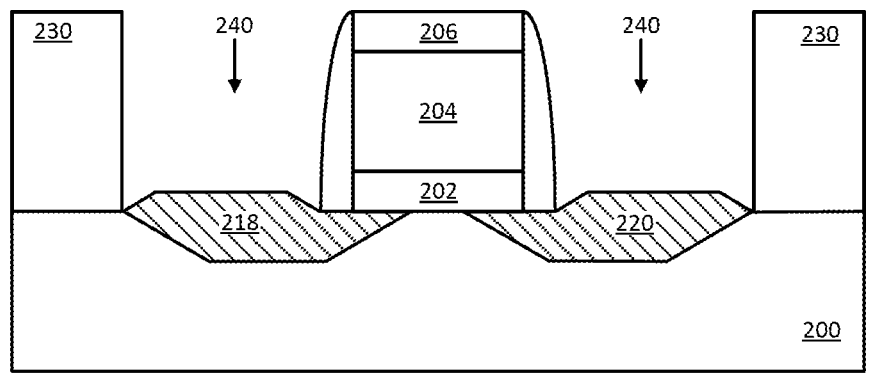
Figure 2E:
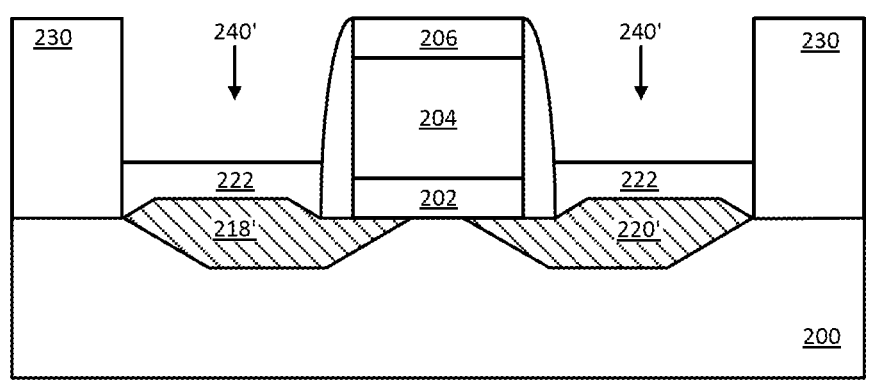

The methods of FIGS. 1 and 1' can optionally continue with removing and replacing 112 the gate stack using, for instance, an RMG process, to form the example resulting gate structure shown in FIG. 2D. In such optional cases, the method may include removing the gate stack (including high-k gate dielectric layer 202, sacrificial/dummy gate electrode 204, and hardmask layer 206) using an etching process as conventionally done. In alternate implementations, only the sacrificial/dummy gate electrode 204 (and hardmask layer 206) is removed. If gate dielectric 202 is removed, the method may include depositing a new gate dielectric layer into the trench opening. Any suitable high-k dielectric materials such as those previously described may be used here, such as hafnium oxide. The same deposition processes may also be used. Replacement of gate dielectric 202 may be used, for example, to address any damage that may have occurred to the original gate dielectric layer during application of the dry and wet etch processes, and/or to replace a low-k or sacrificial dielectric material with a high-k or otherwise desired gate dielectric material. The method may then continue with depositing the metal gate electrode layer into the trench and over the gate dielectric layer. Conventional metal deposition processes may be used to form the metal gate electrode layer, such as CVD, ALD, PVD, electroless plating, or electroplating. The metal gate electrode layer may include, for example, a p-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited followed by a suitable metal gate electrode fill metal such as aluminum. FIG. 2D illustrates an example high-k gate dielectric layer 203 and a metal gate electrode 205 that have been deposited into the trench opening, in accordance with one embodiment. Note that such an RMG process may be carried out at a different time in the method of FIGS. 1 and 1', if so desired.

The methods of FIGS. 1 and 1' can optionally continue with masking-off 114 n-type (e.g., n-MOS) source/drain regions (if present) as commonly done to allow contact patterning so as to open the p-contacts separately from the n-contacts. In such cases, masking-off 114 the n-type regions protects them during subsequent processing of the p-contacts. This can also offer the benefit that when the n-contacts are independently opened, an n-type specific metal may be used for contact resistance lowering reasons. Further, additional benefit may be received as a result of the p and n-contact metals not having to be linked, as in conventional contact processing. Masking-off 114 can be used in structures intended for CMOS devices that have both n-MOS and p-MOS transistors.

The method of FIG. 1 continues with etching 116 to form source/drain contact trenches 240 as shown in example resulting structure 2E. As can also be seen, SiGe layer 218/220 is re-exposed for additional processing as a result of performing contact trench etch 116. Because SiGe layer 218/220 is sacrificial in the example method of FIG. 1, any suitable dry and/or wet etch processes can be used. Recall that in the optional case where n-contact regions are masked-off 114, only p-type contact regions may be re-exposed during contact trench etch 116.

The method of FIG. 1' continues with etching 116' to form source/drain contact trenches 240' as shown in example resulting structure 2E'. As can also be seen, Si cladding layer 222 is re-exposed for additional processing as a result of performing contact trench etch 116'. In this example method, the contact trench etch 116' may be performed so as to preserve Si cladding layer 222 for subsequent deposition. In such cases, an etch stop layer may be used to help preserve Si cladding layer 222 and the etch stop layer (which may be nitride, carbide, or any other material with sufficiently different etch rates than insulator layer 230) can be deposited prior to depositing 110 insulator layer 230. Thus, when performing contact trench etch 116' in cases where an etch stop layer is used, a first etch can be performed to remove insulator layer 230 from the p-contact regions, but effectively stop at the etch stop layer, and then a second etch can be performed to remove the etch stop layer, but effectively stop at Si cladding layer 222.

Figure 2F:
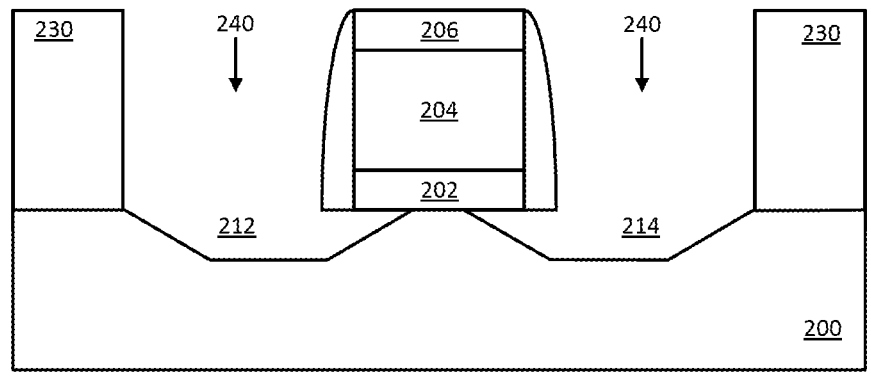
Figure 2G:
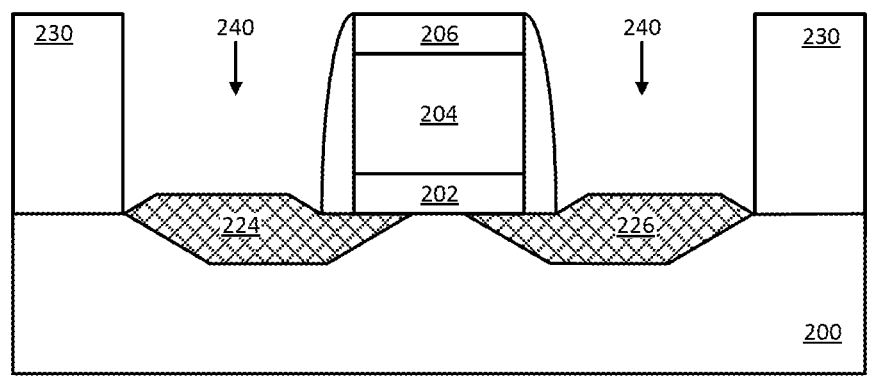

The method of FIG. 1 continues with etching 117 to remove sacrificial SiGe layer 218/220 from the source/drain regions, to form the example resulting structure shown in FIG. 2F. As can be seen in FIG. 2F, the source/drain cavities 212/214 that are re-formed may be the same cavities as, or similar to, the source/drain cavities shown in FIG. 2A. SiGe layer 218/220 (which is a sacrificial layer, in this embodiment) can be removed using an etch 117 that is selective to Si and insulator materials (e.g., it will effectively not remove Si or insulator materials, or remove them at a much slower rate as compared to the rate at which SiGe layer 218/220 is removed). Such selective etches may include, for example, wet etches including water, nitric acid, organic acid (e.g., acetic or citric), and/or hydrofluoric acid, and the selective etches may have a usable etch rate of about 300 Å/min, for example.

The methods of FIGS. 1 and 1' continue with depositing 118 a p-type Ge-rich material in the source/drain regions on a Si surface. In the case of the method of FIG. 1, the Ge-rich layer 224/226 is deposited on a surface of Si substrate 200, as shown in the example resulting structure of FIG. 2G. In the case of the method of FIG. 1', the Ge-rich layer 224'/226' is deposited on a surface of Si cladding layer 222, as shown in the example resulting structure of FIG. 2G'. Depositing 118 may be performed as variously described herein (e.g., using the techniques discussed with reference to depositing 108 and 109, or any other suitable deposition technique). In some example cases, depositing 118 may be performed processing that includes maximum temperatures of 550 or 500 degrees C., for example. In such cases, the processing thermal budget constraints may be dependent on the metal gate material used for the gate electrode during the optional RMG process described above. In some example cases, etching 117 to remove the sacrificial SiGe layer and depositing 118 the Ge-rich layer can be performed in-situ or without air break.

In some embodiments, the Ge-rich layer material may be comprised of at least 50% Ge. Therefore, the Ge-rich layer may be comprised of Ge in the range of 50-100%. In some embodiments, the Ge-rich layer may include Si (e.g., SiGe) and may be comprised of Ge in the range of 50-99%. In some embodiments, the Ge-rich material may include tin (Sn) (e.g., GeSn), with up to 15% Sn. In some such embodiments, the Ge-rich material may also include trace levels of Si (e.g., <5%). Recall that the Ge-rich layer is a p-type layer and therefore is p-type doped (e.g., B doped). In some cases, the p-type Ge-rich layer may be B doped at levels around $2E20$ $cm^{-3}$. Although, in some instances, the p-type Ge-rich layer may be B doped at levels above $5E19$ $cm^{-3}$, and up to $5E21$ $cm^{-3}$, in some example cases.

Figure 2H:
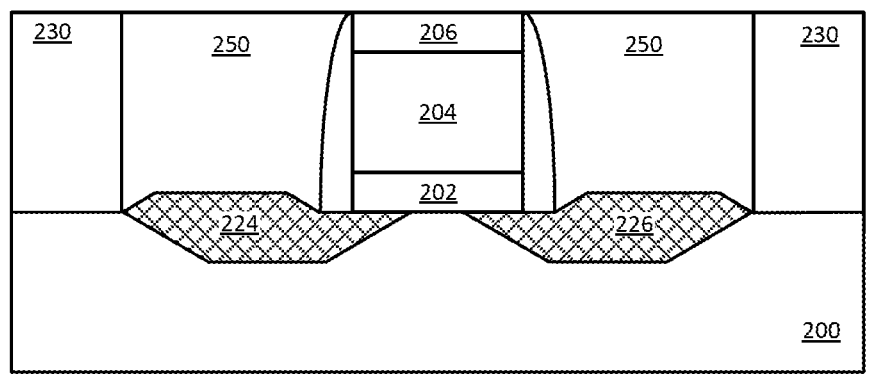
Figure 2G:
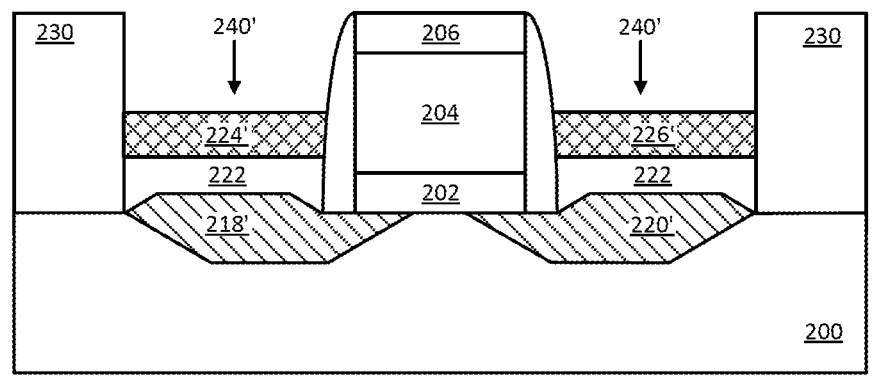
Figure 2H:
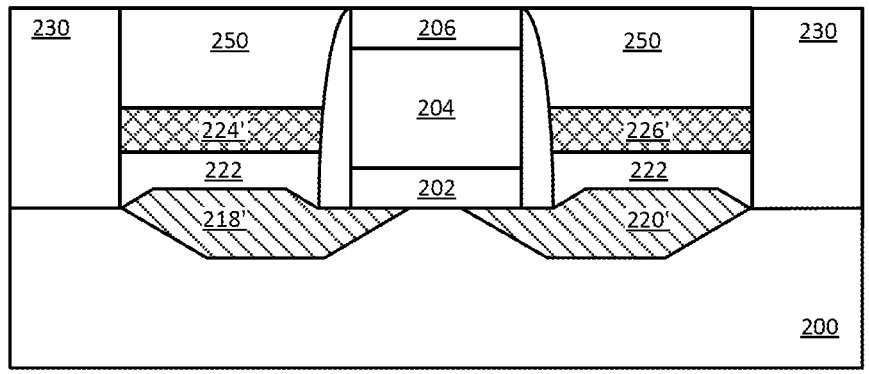

The method of FIGS. 1 and 1' can then continue with depositing 120 source/drain metal contact plugs 250, resulting in the example structures shown in FIGS. 2H and 2H'. The source/drain metal contact plugs 250 may, in some embodiments, include aluminum or tungsten, although any suitably conductive contact metal or alloy can be used, such as silver, nickel-platinum or nickel-aluminum or other alloys of nickel and aluminum, or titanium, using conventional deposition processes. Metalization of the source/drain contacts can be carried out, for example, using a germanidation process (generally, deposition of contact metal and subsequent annealing). For instance, germanidation with nickel, aluminum, nickel-platinum or nickel-aluminum or other alloys of nickel and aluminum, or titanium with or without germanium pre-amorphization implants can be used to form a low resistance germanide. The Ge-rich layers can allow for metal-germanide formation (e.g., nickel-germanium), as will be apparent in light of this disclosure.

The germanidation process can also allow for significantly lower Schottky-barrier height and improved contact resistance over that in conventional metal-silicide systems. For instance, conventional transistors typically use a source/drain SiGe epi process, with Ge concentration in the range of 30-40%. Such conventional systems exhibit external resistance values of about 140 Ohm-um, limited by epi/silicide interfacial resistance, which is high and may impede future gate pitch scaling. Some embodiments of the present disclosure allow for a significant improvement in external resistance in p-MOS devices (e.g., resulting in a 20-30% current flow improvement for a given operating voltage), which can better support p-MOS device scaling. Thus, transistors having source/drain regions including a Ge-rich layer deposited directly on a Si surface as variously described herein, can exhibit relatively lower external resistance values (e.g., lower contact resistance) compared to conventional transistors.

Non-Planar Configuration

A non-planar architecture can be implemented, for instance, using finned or nanowire/nanoribbon configurations. A finned transistor is built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such finned designs are sometimes referred to as tri-gate or finFET configurations. Other types of finned configurations are also available, such as so-called double-gate finFETs, in which the conductive channel principally resides only along the two sidewalls of the fin (and not along the top of the fin).

Figure 3A:
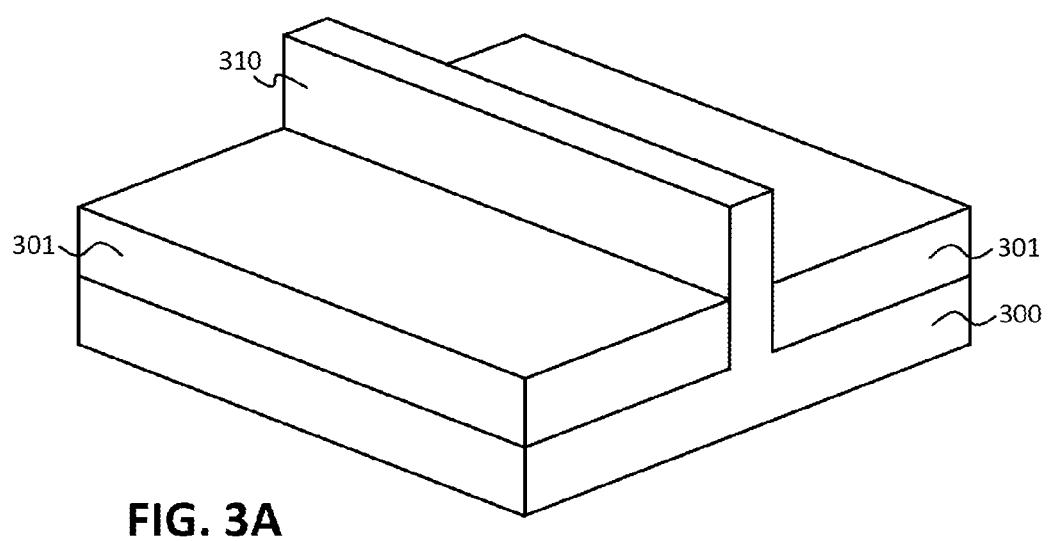
FIGS. 3A-J' illustrate example structures that are formed when carrying out the method of either of FIG. 1 or 1' for non-planar (e.g., finned) transistor architecture, in accordance with various embodiments.

The methods of FIGS. 1 and 1' can be applied to non-planar transistor architectures. FIGS. 3A-3J' illustrate example structures that are formed as those methods (of FIGS. 1 and 1') are carried out for a non-planar transistor architecture, in accordance with some embodiments of the present disclosure. The previous discussion above with respect to FIGS. 1-1' and 2A-H' is equally applicable here, as will be appreciated. Similar numbering is used to identify the features in FIGS. 3A-3J' as was used in FIGS. 2A-H', except that FIGS. 3A-3J' include numbering in the 300s, whereas FIGS. 2A-H' include numbering in the 200s (e.g., substrate 200 is similar to substrate 300, gate electrode 204 is similar to gate electrode 304, etc.) for ease of description. As can be seen in FIG. 3A, the non-planar configuration shown is implemented with a finned structure, which includes substrate 300 and fin 310 extending from the substrate through STI/isolation layer 301.

Figure 3B:
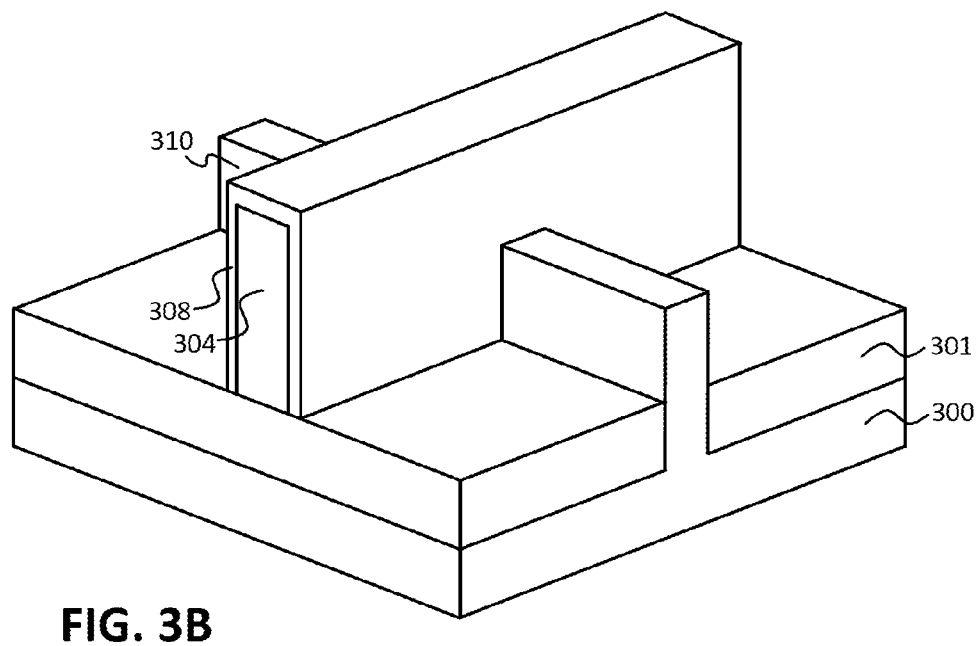
Figure 3C:
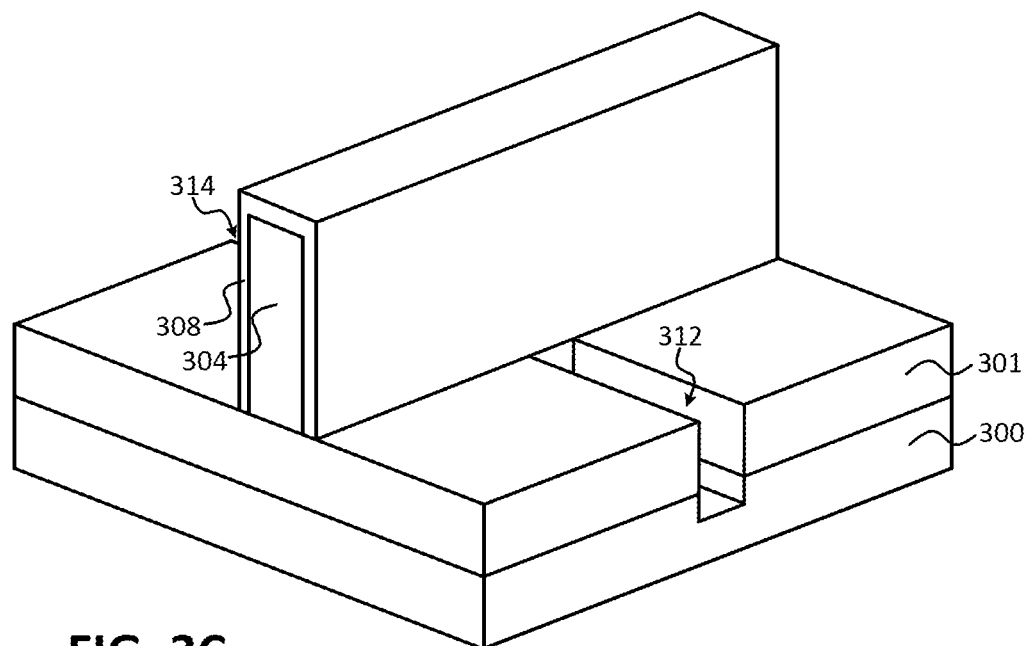
Figure 3D:
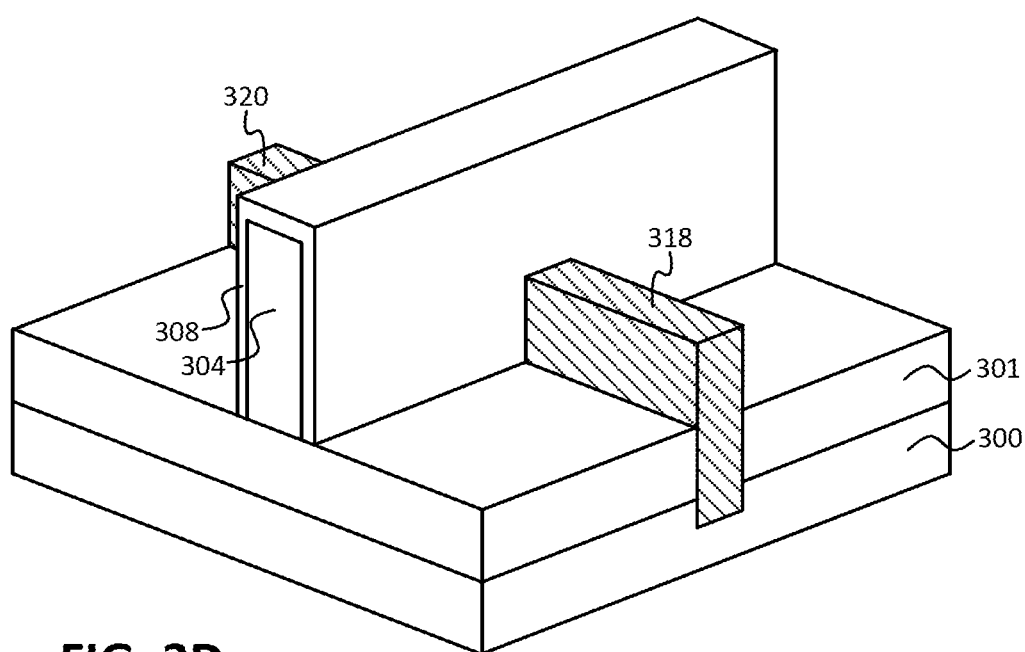
Figure 3D:
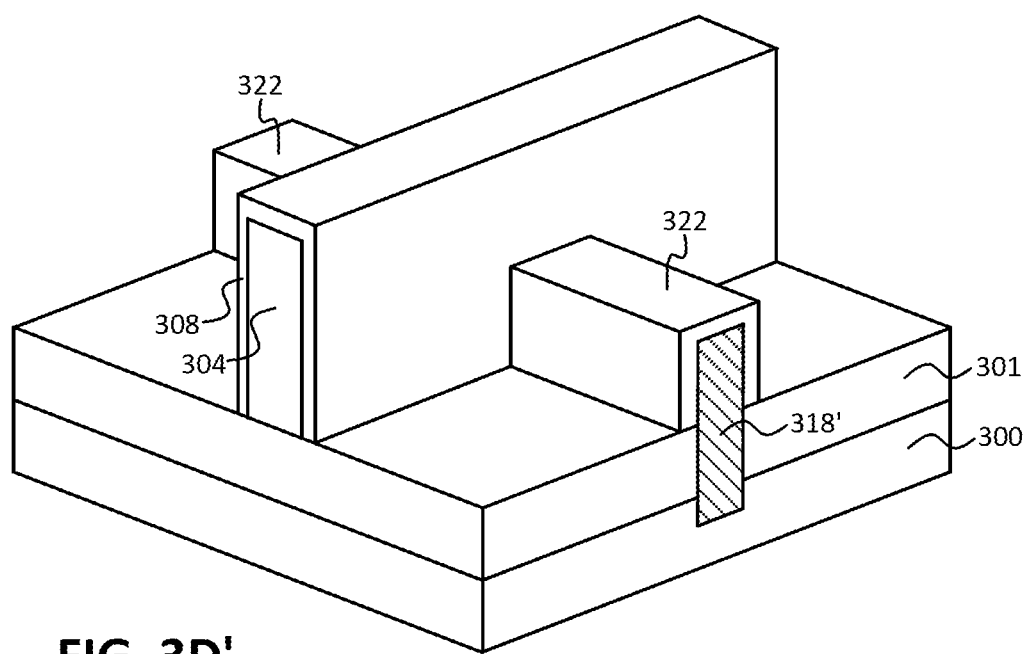

FIG. 3A shows a resulting structure after performing 102 STI on substrate 300, which in this example case, included recessing the STI material to form fin 310. FIG. 3B shows the structure of FIG. 3A after forming 104 the gate stack (including dummy gate electrode 304 and an optional dummy gate dielectric), which in this example embodiment is a dummy/sacrificial gate stack (however, that need not be the case). Note that spacer 308 is also formed over the gate stack, in this embodiment, which may have been formed using spacer deposition and etch as described above. FIG. 3C shows the structure of FIG. 3B after etching 106 source/drain regions 312/314. FIG. 3D shows the structure of FIG. 3C after depositing 108 sacrificial SiGe layer 318/320. FIG. 3D' shows the structure of FIG. 3C after depositing 108' functional SiGe layer 318'/320' and Si cladding layer 322. The sacrificial and functional SiGe layers, as well as deposition of such layers, are discussed above.

Figure 3E:
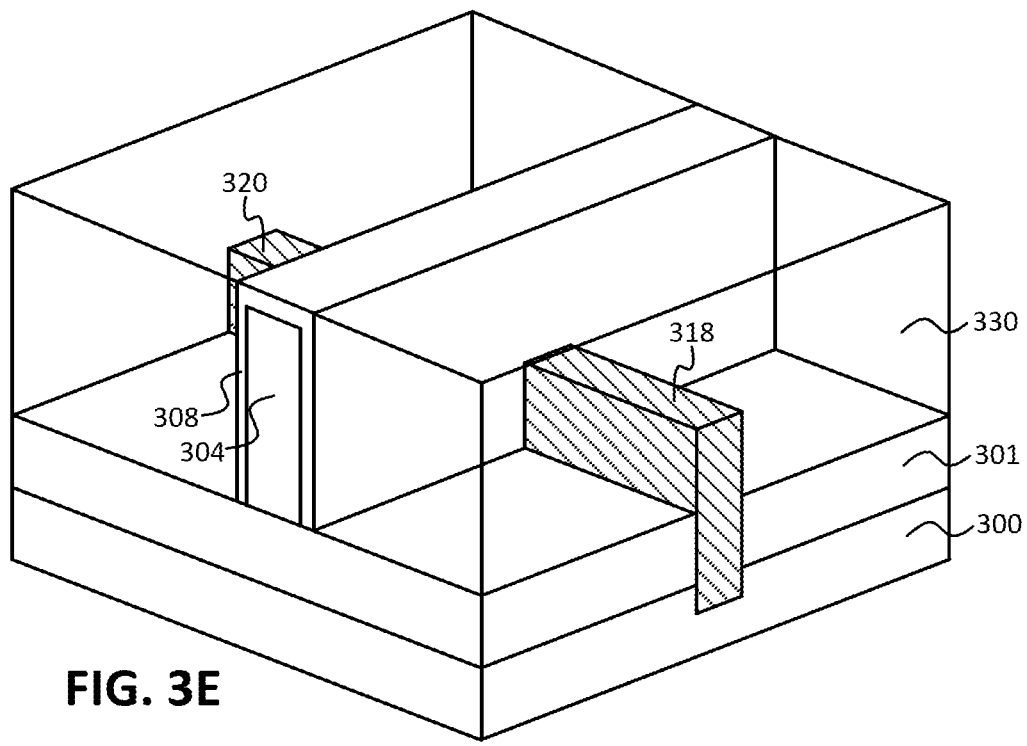
Figure 3F:
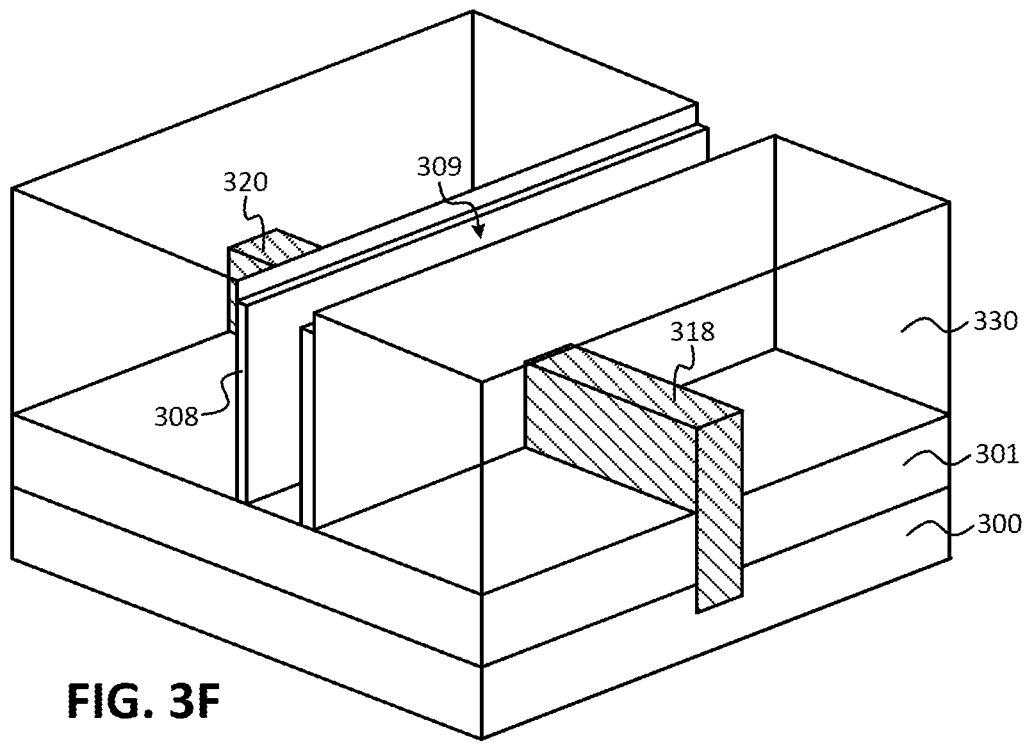
Figure 3G:
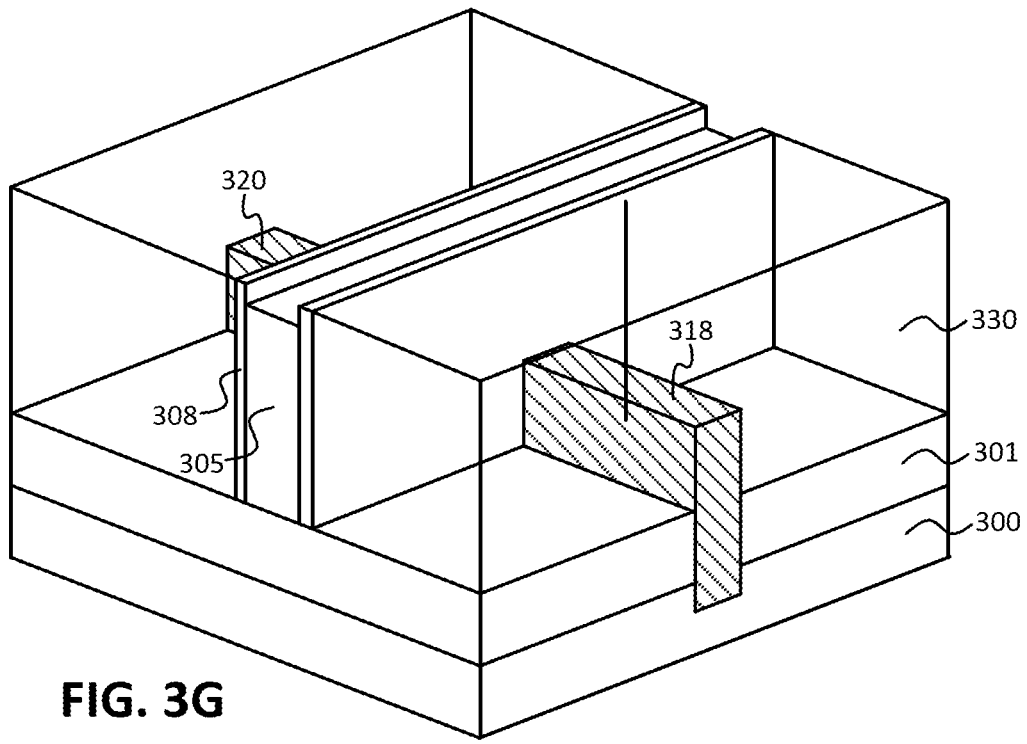
Figure 3H:
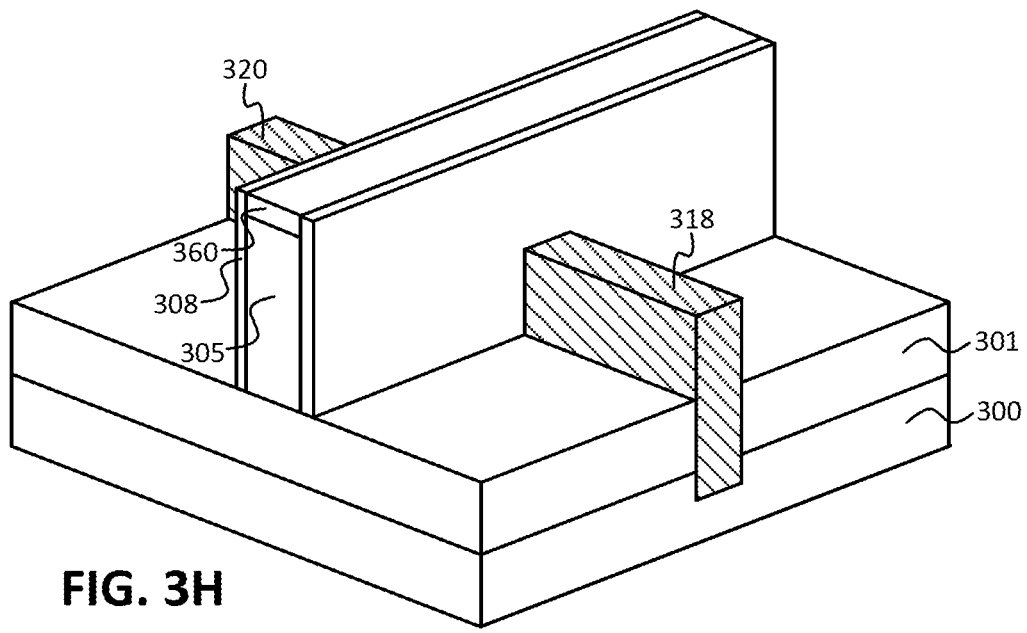

FIG. 3E shows the structure of FIG. 3D after depositing 110 insulator layer 330. FIG. 3F shows the structure of FIG. 3E after removing 112 the dummy gate stack (including dummy gate electrode 304) to re-expose the channel region 309. FIG. 3G shows the structure of FIG. 3F after replacing 112 the dummy gate stack with a new gate stack (e.g., with a new gate dielectric and a metal gate electrode 305). Note that, in some embodiments, removing/replacing 112 the gate stack may be an optional process, as previously described. FIG. 3H shows the structure of FIG. 3G after performing 116 contact trench etch to remove insulator 330 from the regions that will become p-contacts. FIG. 3H also shows optional hardmask 360 on the gate stack. Note that an optional masking-off 114 of n-contact regions (if present) may have been performed prior to contact trench etch 116, to only open the p-contact regions. Also note that Si cladding layer 322 would be shown in FIGS. 3E-H in an embodiment that includes a functional SiGe layer 318'/320', as will be apparent in light of this disclosure.

Figure 3I:
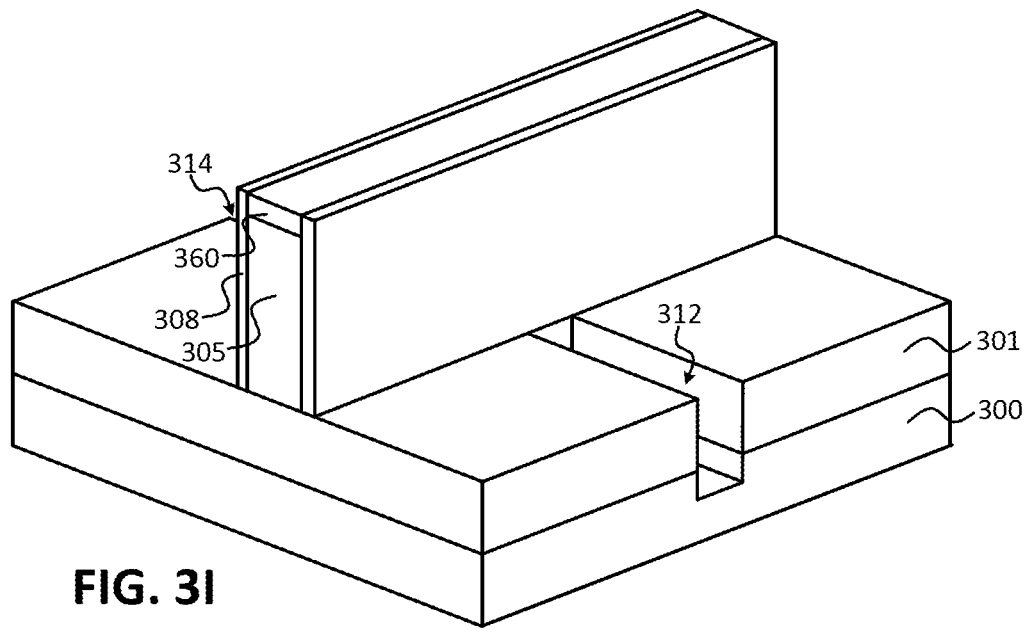
Figure 3J:
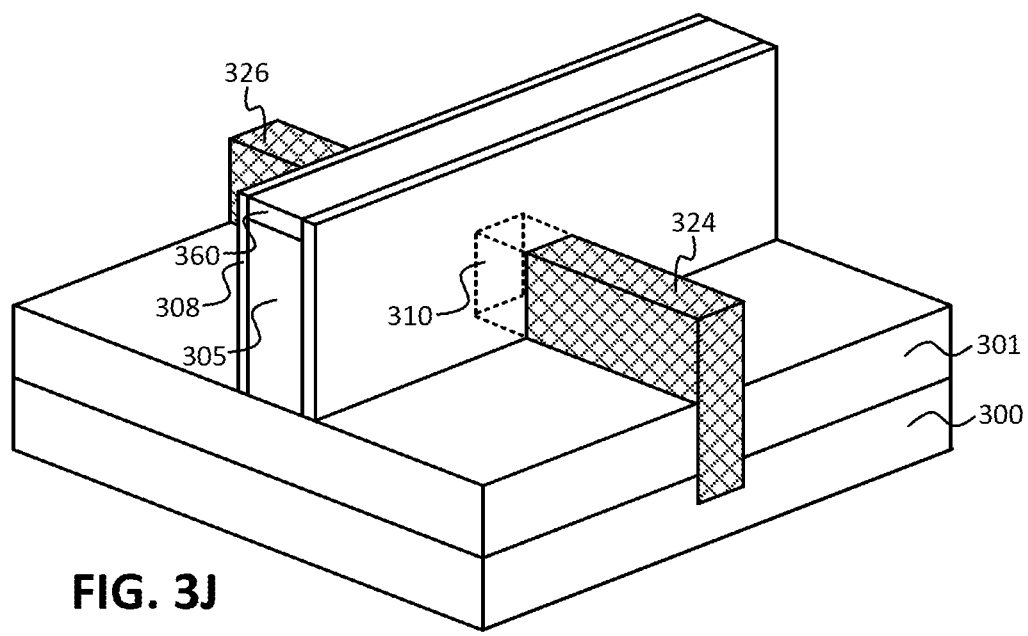
Figure 3J:
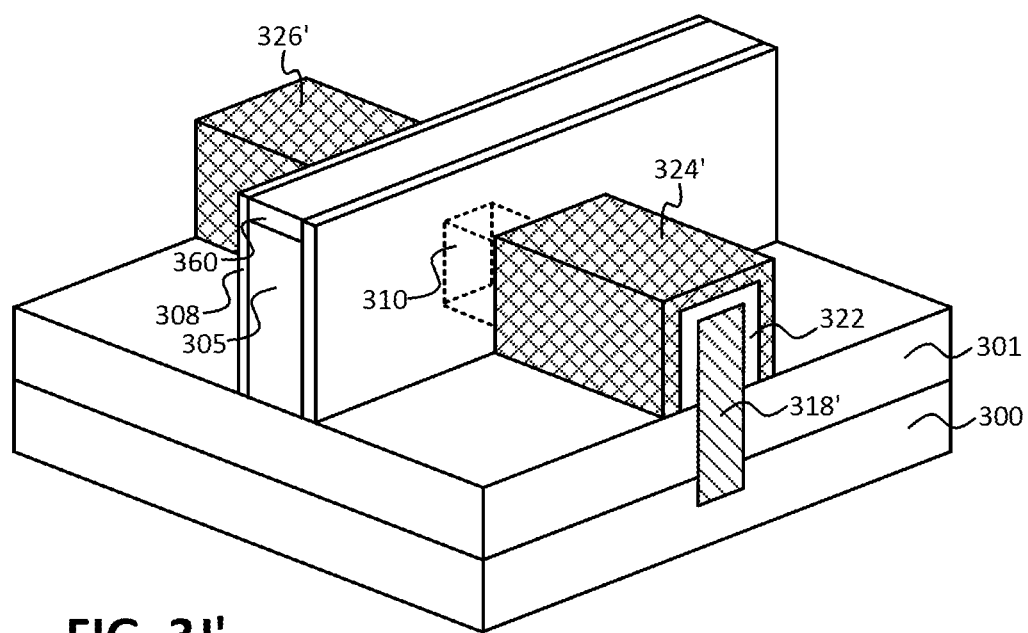

FIG. 3I shows the structure of FIG. 3H after etching 117 to remove SiGe layer 318/320 from the source/drain regions and form source/drain cavities 312/314. As can be seen in FIG. 3I, the source/drain cavities 312/314 that are re-formed may be the same cavities as, or similar to, the source/drain cavities shown in FIG. 3C. FIG. 3J shows the structure of FIG. 3I after depositing 118 p-type Ge-rich layer 324/326. FIG. 3J' shows a resulting structure after p-type Ge-rich layer 324'/326' has been deposited on Si cladding layer 322 (after contact trench etch 116' was performed). In this embodiment, SiGe layer 318'/320' is a functional p-type layer, as previously described. Metal plugs (not shown) can then be deposited 120 in the source/drain regions of FIGS. 3J/J', as described herein, to provide contacts for the finned p-MOS device. Due to the layout and design rules, there will be a population of inactive transistors that have no contact trench or metal plugs. These dummy devices would retain the originally deposited source/drain material at end of line.

For example, for these dummy devices, the SiGe layer as variously described herein (whether sacrificial, or functional and clad with an Si layer) may be present in the source/drain regions, and the p-type Ge-rich layer deposited after source/drain contact trench etch as variously described herein would be absent.

As will further be appreciated, note that an alternative to the finned non-planar configuration as shown is a double-gate architecture, which would include a dielectric/isolation layer on top of fin 310. Further note that the example shapes of any layers (including SiGe layers 318/320 and 318'/320', Si cladding layer 322, and Ge-rich layer 324/326 and 324'/326') are not intended to limit the present disclosure to any particular source/drain types or formation processes, and other shapes will be apparent in light of this disclosure (e.g., round, square or rectangular regions may be implemented).

Figure 4:
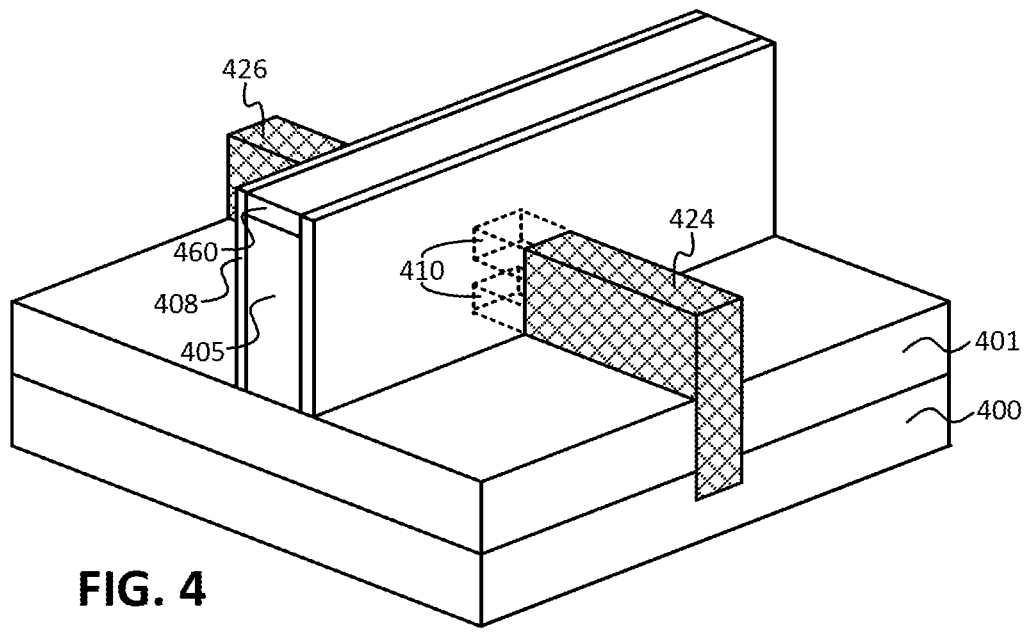
FIG. 4 shows a perspective view of a nanowire/nanoribbon transistor structure formed when carrying out the method of FIG. 1, in accordance with an embodiment.
Figure 4:
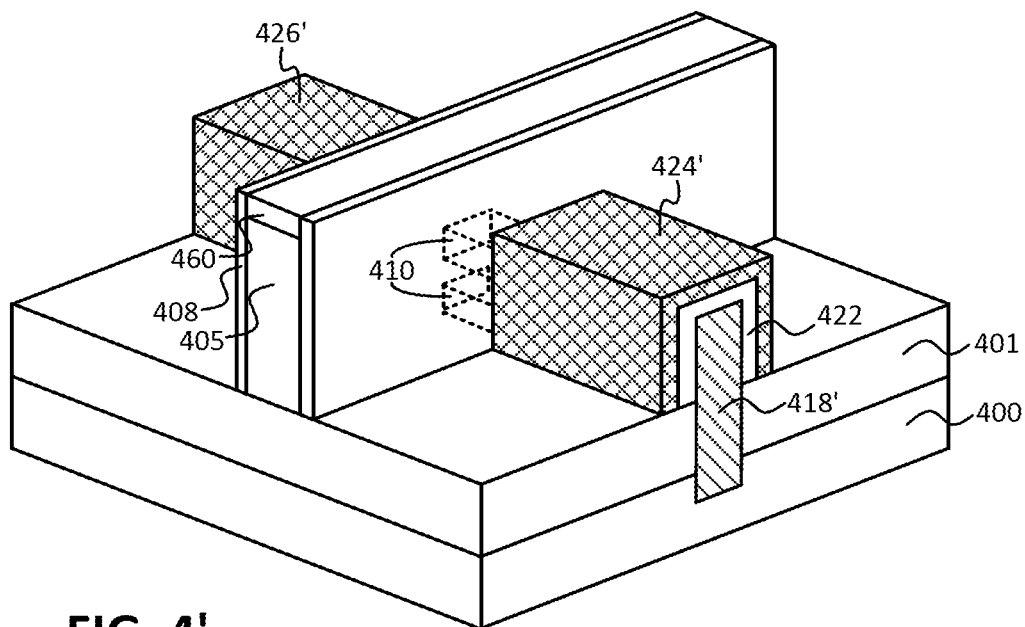

FIGS. 4 and 4' show perspective views of nanowire transistor structures formed in accordance with some embodiments of the present disclosure. A nanowire transistor (sometimes referred to as gate-all-around FET) is configured similarly to a fin-based transistor, but instead of a fin, a nanowire is used and the gate material generally surrounds the channel region on all sides. Depending on the particular design, some nanowire transistors have, for instance, four effective gates. As can be seen, FIG. 4 shows a nanowire transistor structure formed with a sacrificial SiGe layer and FIG. 4' shows a nanowire transistor structure formed with a functional SiGe layer, as variously described herein. FIGS. 4 and 4' illustrate a nanowire channel architecture having two nanowires 410, although other embodiments can have any number of wires. The nanowires 410 can be implemented, for example, with p-channel silicon or germanium or SiGe nanowire. Just as with the finned configuration shown in FIG. 3J, the nanowire configuration shown in FIG. 4 includes Ge-rich layer 424/426 deposited on Si substrate 400 in the source/drain regions. And just as with the finned configuration shown in FIG. 3J', the nanowire configuration shown in FIG. 4' includes Ge-rich layer 424'/426' deposited on Si cladding layer 422 (which is deposited on functional p-type SiGe layer 418'/420').

Example System

Figure 5:
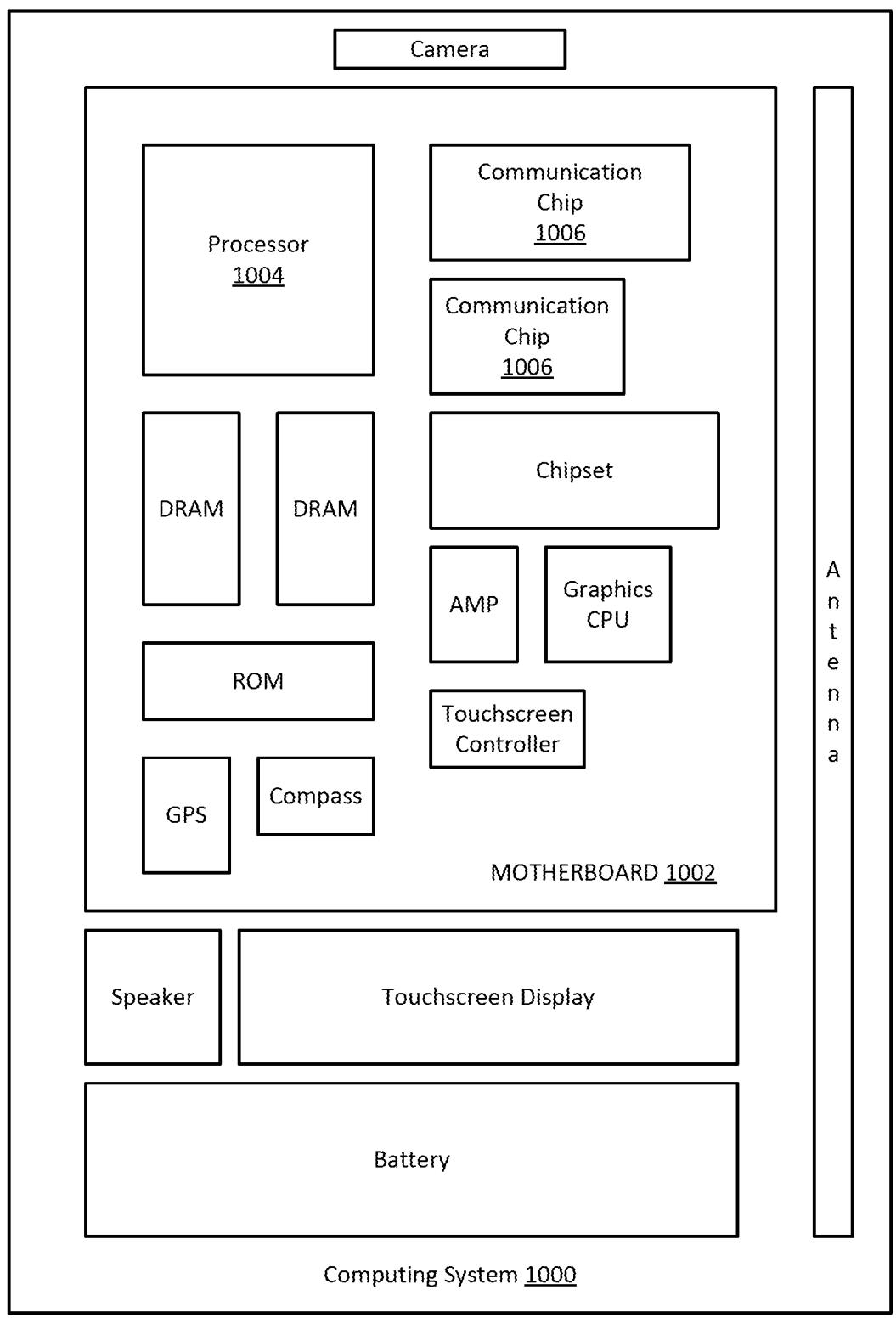
FIG. 5 illustrates a computing system implemented with one or more transistor structures in accordance with one or more embodiments of the present disclosure.

FIG. 5 illustrates a computing system 1000 implemented with one or more transistors configured in accordance with one or more embodiments of the present disclosure. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more semiconductor device structures as variously described herein (e.g., p-MOS transistor devices including source/drain regions having a Ge-rich layer deposited directly on a Si surface). These transistor structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as NFC, Wi-Fi, and Bluetooth, and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard memory circuitry that is implemented with one or more transistor structures as variously described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as variously described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more transistor devices as variously described herein.

Further Example Embodiments

The following examples pertain to further embodiments, from which numerous permutations and configurations will be apparent.

Example 1 is a transistor device, comprising: a substrate having a channel region; a gate electrode above the channel region; and source/drain regions formed on and/or in the substrate and adjacent to the channel region, each of the source/drain regions comprising a p-type germanium (Ge)-rich layer deposited directly on a silicon (Si) surface, wherein the p-type Ge-rich layer comprises at least 50% Ge.

Example 2 includes the subject matter of Example 1, wherein the Si surface in the source/drain regions is a surface of the substrate.

Example 3 includes the subject matter of Example 1, wherein the Si surface in the source/drain regions is a surface of a Si cladding layer deposited on a p-type silicon germanium (SiGe) layer.

Example 4 includes the subject matter of Example 3, wherein the p-type SiGe layer comprises 30-70% Ge.

Example 5 includes the subject matter of any of Examples 1-4, wherein the p-type Ge-rich layer comprises silicon germanium (SiGe).

Example 6 includes the subject matter of any of Examples 1-4, wherein the p-type Ge-rich layer comprises germanium tin (GeSn) with up to 15% Sn.

Example 7 includes the subject matter of Example 6, wherein the p-type Ge-rich layer further comprises up to 5% Si.

Example 8 includes the subject matter of any of Examples 1-7, wherein the p-type Ge-rich layer is boron (B) doped at levels above 1E20 $cm^{-3}$.

Example 9 includes the subject matter of any of Examples 1-8, wherein the Si surface is undoped or has doping levels below 1E19 $cm^{-3}$.

Example 10 includes the subject matter of any of Examples 1-9, further comprising metal-germanide source/drain contacts.

Example 11 includes a CMOS device comprising an n-MOS device and the subject matter of any of Examples 1-10.

Example 12 includes the subject matter of any of Examples 1-11, wherein the device has a planar, finned, nanowire, or nanoribbon configuration.

Example 13 includes an integrated circuit comprising the subject matter of any of Examples 1-12.

Example 14 includes the subject matter of Example 13, further comprising additional source/drain regions, wherein the additional source/drain regions lack metal contacts and comprise a silicon germanium (SiGe) layer.

Example 15 includes the subject matter of Example 14, wherein the SiGe layer comprises 15-30% Ge and is undoped.

Example 16 includes the subject matter of Example 14, further comprising a Si cladding layer deposited on the SiGe layer, wherein the SiGe layer comprises 30-70% Ge and is p-type doped Example 17 includes a computing system comprising the subject matter of any of Examples 1-16.

Example 18 is a method for forming a transistor device, the method comprising: performing shallow trench isolation (STI) on a silicon (Si) substrate having a channel region; forming a gate stack above the channel region; depositing a sacrificial silicon germanium (SiGe) layer in source/drain regions adjacent to the channel region; depositing an insulator material over topography of the gate stack and source/drain regions; performing source/drain contact trench etch; etching to remove the sacrificial SiGe layer from the source/drain contact trenches and re-expose a surface of the Si substrate; and depositing a p-type germanium (Ge)-rich layer in the source/drain contact trenches on the re-exposed surface of the Si substrate, wherein the p-type Ge-rich layer comprises at least 50% Ge.

Example 19 includes the subject matter of Example 18, further comprising performing a gate replacement process to replace the gate stack after depositing an insulator material over topography of the gate stack and source/drain regions.

Example 20 includes the subject matter of any of Examples 18-19, further comprising masking-off n-type regions prior to performing source/drain contact trench etch to expose only p-contact regions.

Example 21 includes the subject matter of any of Examples 18-20, further comprising depositing metal source/drain contacts on the p-type Ge-rich layer.

Example 22 includes the subject matter of any of Examples 18-21, wherein the p-type Ge-rich layer is deposited at temperatures of less than 500 degrees C.

Example 23 includes the subject matter of any of Examples 18-22, wherein etching to remove the sacrificial SiGe layer includes using a SiGe etch that is selective to silicon (Si) and insulator materials.

Example 24 includes the subject matter of any of Examples 18-23, wherein etching to remove the sacrificial SiGe layer is a wet etch including water, nitric acid, organic acid, and/or hydrofluoric acid.

Example 25 includes the subject matter of any of Examples 18-24, wherein the transistor device is a p-MOS or CMOS device.

Example 26 includes the subject matter of any of Examples 18-25, wherein the device has a planar, finned, nanowire, or nanoribbon configuration.

Example 27 includes the subject matter of any of Examples 18-26, wherein the SiGe layer comprises 15-30% Ge and is undoped.

Example 28 includes the subject matter of any of Examples 18-27, wherein the p-type Ge-rich layer comprises silicon germanium (SiGe).

Example 29 includes the subject matter of any of Examples 18-27, wherein the p-type Ge-rich layer comprises germanium tin (GeSn) with up to 15% Sn.

Example 30 includes the subject matter of Example 29, wherein the p-type Ge-rich layer further comprises up to 5% Si.

Example 31 includes the subject matter of any of Examples 18-30, wherein the p-type Ge-rich layer is boron (B) doped at levels above 1E20 $cm^{-3}$.

Example 32 is a method for forming a transistor device, the method comprising: performing shallow trench isolation (STI) on a substrate having a channel region; forming a gate stack above the channel region; depositing a p-type silicon germanium (SiGe) layer in source/drain regions adjacent to the channel region; depositing a silicon (Si) cladding layer on the p-type SiGe layer; depositing an insulator material over topography of the gate stack and source/drain regions; performing source/drain contact trench etch; and depositing a p-type germanium (Ge)-rich layer on the Si cladding layer in the source/drain contact trenches, wherein the p-type Ge-rich layer comprises at least 50% Ge.

Example 33 includes the subject matter of Example 32, further comprising performing a gate replacement process to replace the gate stack after depositing an insulator material over topography of the gate stack and source/drain regions.

Example 34 includes the subject matter of any of Examples 32-33, further comprising masking-off n-type regions prior to performing source/drain contact trench etch to expose only p-contact regions.

Example 35 includes the subject matter of any of Examples 32-34, further comprising depositing metal source/drain contacts on the p-type Ge-rich layer.

Example 36 includes the subject matter of any of Examples 32-35, wherein the p-type Ge-rich layer is deposited at temperatures of less than 500 degrees C.

Example 37 includes the subject matter of any of Examples 32-36, further comprising depositing an etch stop layer over topography of the gate stack and source/drain regions prior to depositing the insulator layer, wherein the etch stop layer helps protect the Si cladding layer during source/drain contact trench etch.

Example 38 includes the subject matter of Example 37, wherein the etch stop layer is one of a nitride or carbide material.

Example 39 includes the subject matter of any of Examples 32-38, wherein the transistor device is a p-MOS or CMOS device.

Example 40 includes the subject matter of any of Examples 32-39, wherein the device has a planar, finned, nanowire, or nanoribbon configuration.

Example 41 includes the subject matter of any of Examples 32-40, wherein the SiGe layer comprises 30-70% Ge.

Example 42 includes the subject matter of any of Examples 32-41, wherein the p-type Ge-rich layer comprises silicon germanium (SiGe).

Example 43 includes the subject matter of any of Examples 32-42, wherein the p-type Ge-rich layer comprises germanium tin (GeSn) with up to 15% Sn.

Example 44 includes the subject matter of Example 43, wherein the p-type Ge-rich layer further comprises up to 5% Si.

Example 45 includes the subject matter of any of Examples 32-44, wherein the p-type Ge-rich layer is boron (B) doped at levels above 1E20 $cm^{-3}$.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A transistor device, comprising:
   a substrate having a channel region;
   a gate electrode above the channel region; and
   source/drain regions adjacent to the channel region, each of the source/drain regions comprising a p-type germanium (Ge)-rich layer in direct contact with a silicon (Si) surface, wherein the p-type Ge-rich layer comprises at least 50% Ge throughout the entire p-type Ge-rich layer.

2. The device of claim 1, wherein the Si surface in the source/drain regions is a surface of the substrate.

3. The device of claim 1, wherein the Si surface in the source/drain regions is a surface of a Si cladding layer deposited on a p-type silicon germanium (SiGe) layer.

4. The device of claim 3, wherein the p-type SiGe layer comprises 30-70% Ge.

5. The device of claim 1, wherein the p-type Ge-rich layer comprises silicon germanium (SiGe).

6. The device of claim 1, wherein the p-type Ge-rich layer comprises germanium tin (GeSn) with up to 15% Sn.

7. The device of claim 6, wherein the p-type Ge-rich layer further comprises up to 5% Si.

8. The device of claim 1, wherein the p-type Ge-rich layer is boron (B) doped at levels above $1E20$ cm$^{-3}$.

9. The device of claim 1, wherein the Si surface is undoped or has doping levels below $1E19$ cm$^{-3}$.

10. The device of claim 1, further comprising metal-germanide source/drain contacts.

11. A CMOS device comprising an n-MOS device and the device of claim 1.

12. The device of claim 1, wherein the device has a planar, finned, nanowire, or nanoribbon configuration.

13. An integrated circuit comprising the device of claim 1.

14. The integrated circuit of claim 13, further comprising additional source/drain regions, wherein the additional source/drain regions lack metal contacts and comprise a silicon germanium (SiGe) layer.

15. A computing system comprising the device of claim 1.

16. A method for forming a transistor device, the method comprising:
    performing shallow trench isolation (STI) on a silicon (Si) substrate having a channel region;
    forming a gate stack above the channel region;
    depositing a sacrificial silicon germanium (SiGe) layer in source/drain regions adjacent to the channel region;
    depositing an insulator material over topography of the gate stack and source/drain regions;
    performing source/drain contact trench etch;
    etching to remove the sacrificial SiGe layer from the source/drain contact trenches and re-expose a surface of the Si substrate; and
    depositing a p-type germanium (Ge)-rich layer in the source/drain contact trenches on the re-exposed surface of the Si substrate, wherein the p-type Ge-rich layer comprises at least 50% Ge throughout the entire p-type Ge-rich layer.

17. The method of claim 16, wherein the p-type Ge-rich layer is deposited at temperatures of less than 500 degrees C.

18. The method of claim 16, wherein etching to remove the sacrificial SiGe layer includes using a SiGe etch that is selective to silicon (Si) and insulator materials.

19. The method of claim 16, wherein etching to remove the sacrificial SiGe layer is a wet etch including water, nitric acid, organic acid, and/or hydrofluoric acid.

20. The method of claim 16, wherein the sacrificial SiGe layer comprises 15-30% Ge and is undoped.

21. A method for forming a transistor device, the method comprising:
    performing shallow trench isolation (STI) on a substrate having a channel region;
    forming a gate stack above the channel region;
    depositing a p-type silicon germanium (SiGe) layer in source/drain regions adjacent to the channel region;
    depositing a silicon (Si) cladding layer on the p-type SiGe layer;
    depositing an insulator material over topography of the gate stack and source/drain regions;
    performing source/drain contact trench etch; and
    depositing a p-type germanium (Ge)-rich layer on the Si cladding layer in the source/drain contact trenches, wherein the p-type Ge-rich layer comprises at least 50% Ge throughout the entire p-type Ge-rich layer.

22. The method of claim 21, wherein the p-type Ge-rich layer is deposited at temperatures of less than 500 degrees C.

23. The method of claim 21, further comprising depositing an etch stop layer over topography of the gate stack and source/drain regions prior to depositing the insulator layer, wherein the etch stop layer helps protect the Si cladding layer during source/drain contact trench etch.

24. The method of claim 23, wherein the etch stop layer is one of a nitride or carbide material.

25. The method of claim 21, wherein the p-type SiGe layer comprises 30-70% Ge.

* * * * *

UNITED STATES PATENT AND TRADEMARK OFFICE
CERTIFICATE OF CORRECTION

PATENT NO. : 9,859,424 B2  
APPLICATION NO. : 15/116453  
DATED : January 2, 2018  
INVENTOR(S) : Glenn A. Glass et al.

Page 1 of 1

It is certified that error appears in the above-identified patent and that said Letters Patent is hereby corrected as shown below:

On the Title Page

Item (54) and in the Specification, Column 1, Lines 1-3, in the Title, please replace:
"TECHNIQUES FOR INTEGRATION OF GE-RICH P-MOS SOURCE/DRAIN CONTACTS"
With:
--TECHNIQUES FOR INTEGRATION OF GE-RICH P-MOS SOURCE/DRAIN--

Signed and Sealed this
Twenty-second Day of May, 2018

Andrei Iancu
*Director of the United States Patent and Trademark Office*